United States Patent
Tanahashi

(10) Patent No.: US 6,968,025 B2
(45) Date of Patent: Nov. 22, 2005

(54) HIGH-SPEED TRANSMISSION SYSTEM HAVING A LOW LATENCY

(75) Inventor: Toshio Tanahashi, Tokyo (JP)

(73) Assignee: NEC Corporation, Tokyo (JP)

( * ) Notice: Subject to any disclaimer, the term of this patent is extended or adjusted under 35 U.S.C. 154(b) by 773 days.

(21) Appl. No.: 10/000,153

(22) Filed: Dec. 4, 2001

(65) Prior Publication Data

US 2002/0067785 A1    Jun. 6, 2002

(30) Foreign Application Priority Data

Dec. 5, 2000    (JP) .............................. 2000-369354

(51) Int. Cl.[7] .......................... H04L 7/00; H04L 12/50
(52) U.S. Cl. ...................... 375/355; 356/357; 356/358; 370/395.62
(58) Field of Search .............................. 375/354, 356, 375/370, 373, 376, 327; 370/395.62

(56) References Cited

U.S. PATENT DOCUMENTS

| | | | |
|---|---|---|---|
| 6,522,684 B2 * | 2/2003 | Okubo et al. | 375/147 |
| 6,775,342 B1 * | 8/2004 | Young et al. | 375/371 |
| 6,788,754 B1 * | 9/2004 | Liepe | 375/375 |
| 2001/0033630 A1 * | 10/2001 | Hassoun et al. | 375/376 |

FOREIGN PATENT DOCUMENTS

| | | |
|---|---|---|
| JP | 11-340839 | 12/1999 |
| JP | 2000-216744 | 8/2000 |

* cited by examiner

*Primary Examiner*—Jay K. Patel
*Assistant Examiner*—Qutub Ghulamali
(74) *Attorney, Agent, or Firm*—McGinn IP Law Group, PLLC

(57) ABSTRACT

In addition to a first transmitter circuit, a plurality of transmission lines and a first data processing circuit in the receive side, so as to cause a DLL circuit to be regulated that regulates timing of a sampling clock of the data signal, a second first transmitter circuit, a transmission line and a second data processing circuit are provided, when a second specific signal string is sent, a regulation start signal string is caused to be distributed by the second data processing circuit, regulation is caused to be made for a DLL circuit of the first data processing circuit by a regulation signal string, the data starting with the bit next to a first specific signal string detected in the data signal is written into a m-address n-bit FIFO circuit, simultaneously a read address synchronized with a system clock is generated from a third specific signal string that came to the second data processing circuit, whereby the data is recovered.

24 Claims, 14 Drawing Sheets

FIG. 3
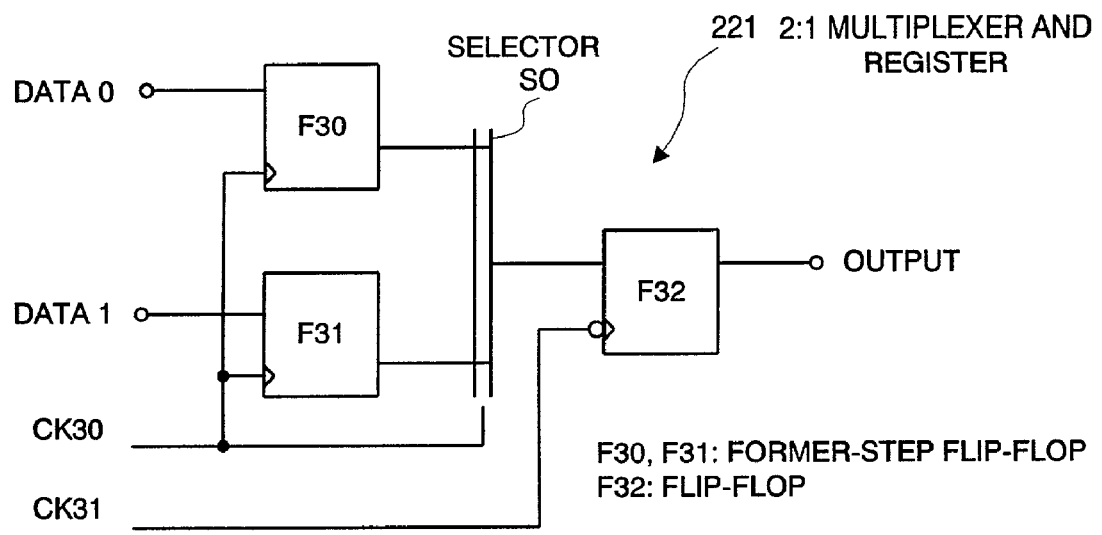
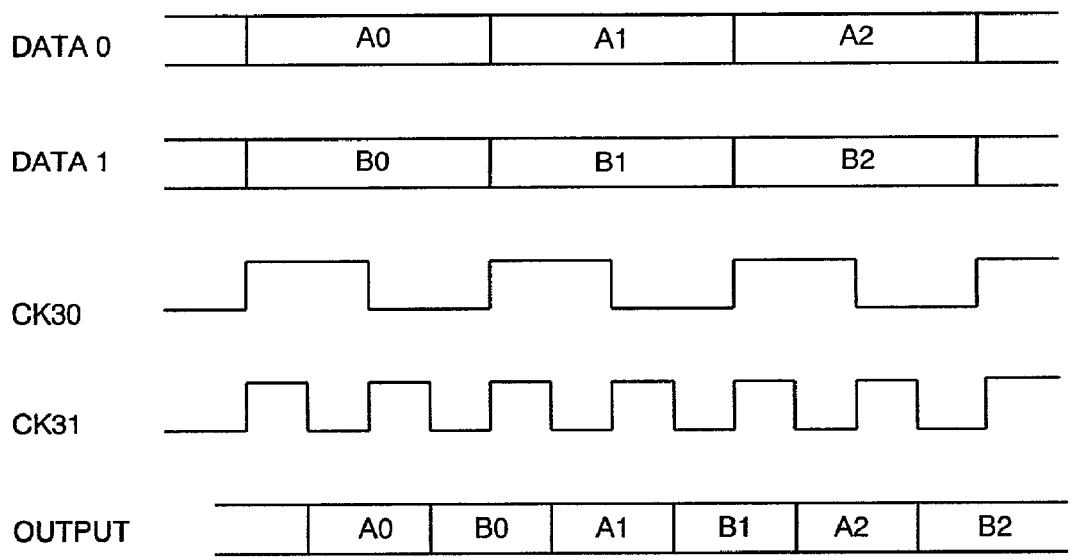

FIG. 4
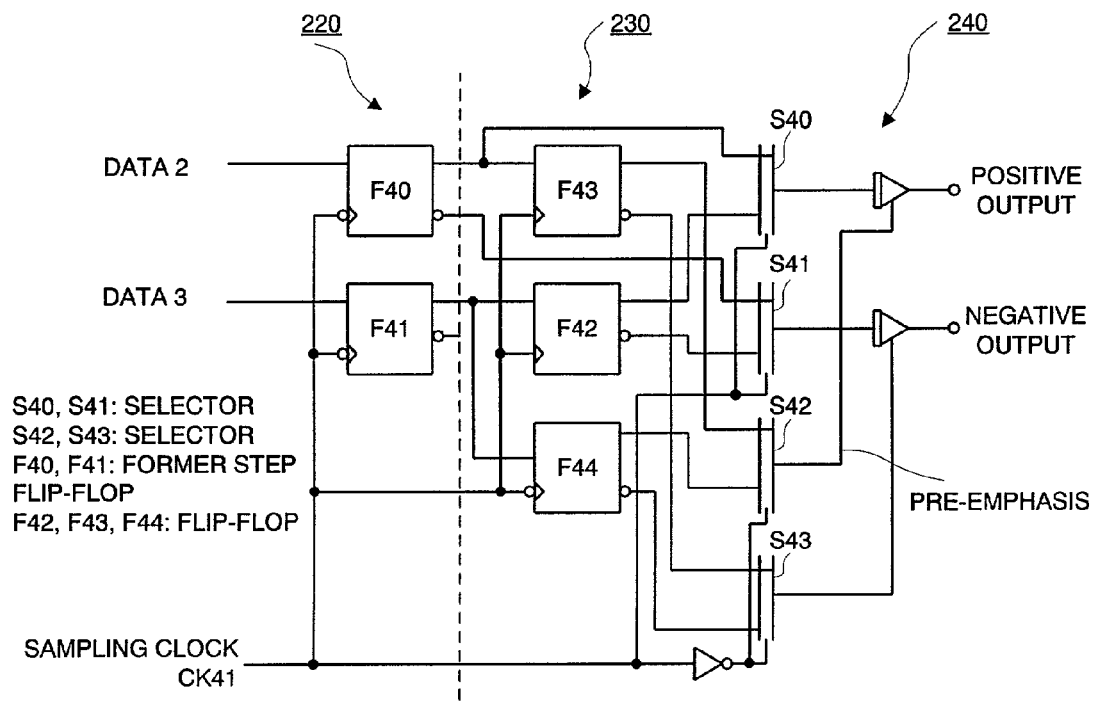
S40, S41: SELECTOR
S42, S43: SELECTOR
F40, F41: FORMER STEP FLIP-FLOP
F42, F43, F44: FLIP-FLOP
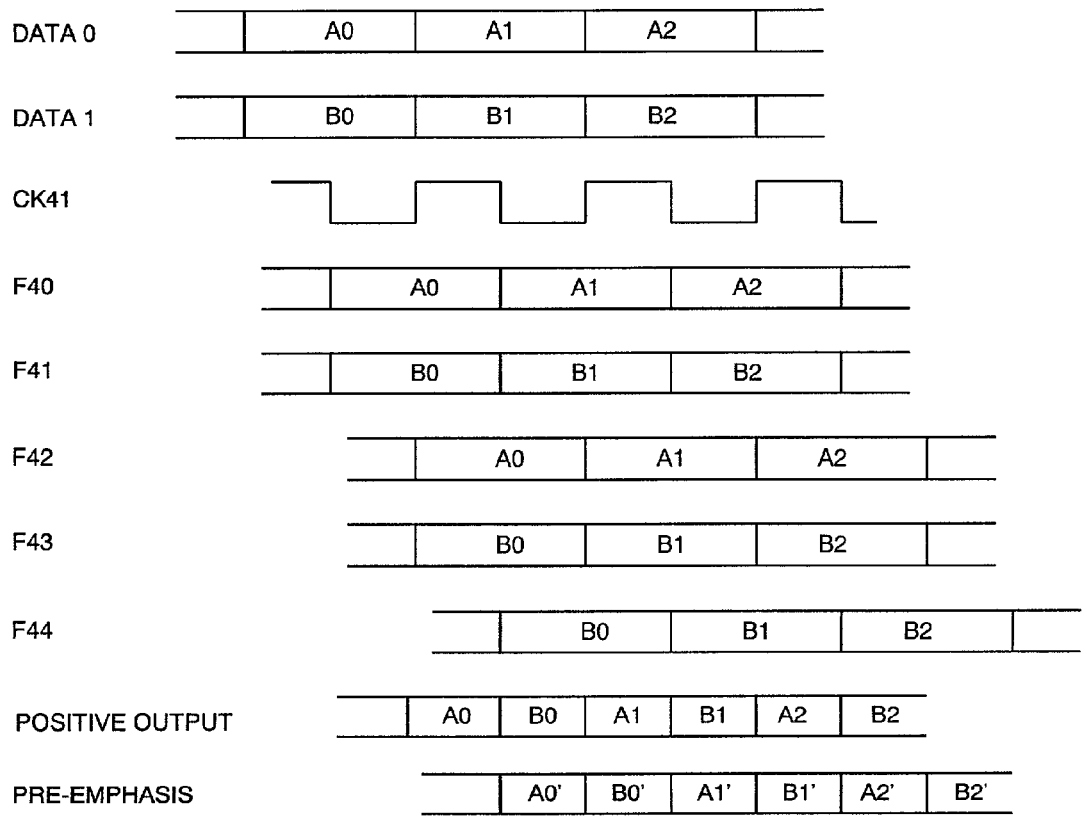

FIG. 7
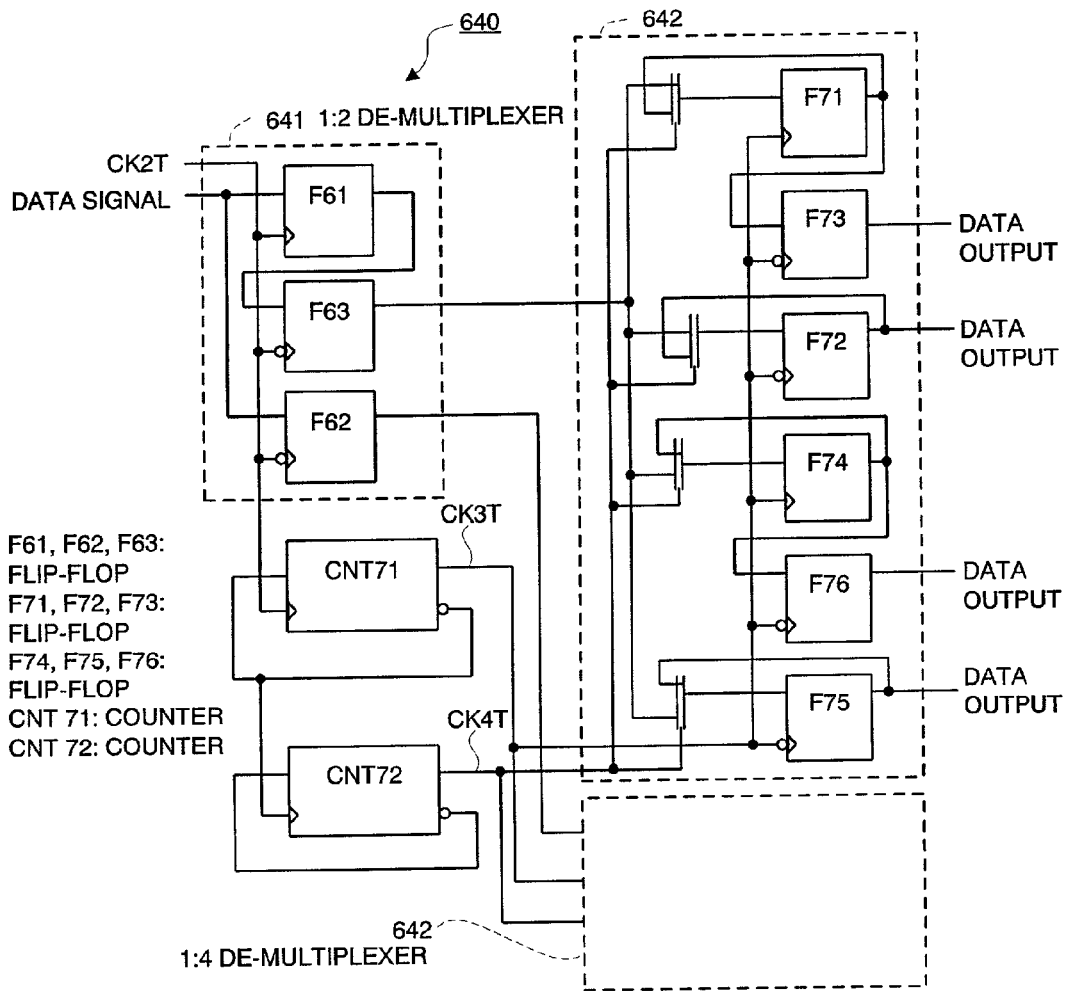
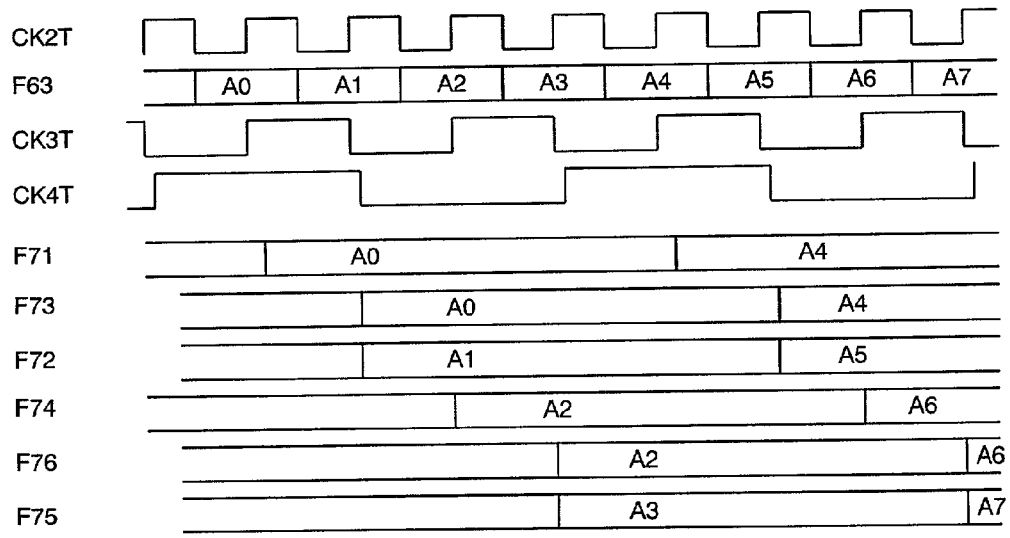

HIGH-SPEED TRANSMISSION SYSTEM HAVING A LOW LATENCY

BACKGROUND OF THE INVENTION

The present invention relates to a high-speed transmission system having a low latency for use in an information processing unit, more particularly to improvement in a high-speed transmission system that transmits a serial signal using a plurality of transmission lines in a transmission system that is used for data transmission among a plurality of processors and between the processor and a memory, which requires a highly speedy broadband data transmission.

Conventionally, in such a highly speedy broadband transmission system, generally, transmission was made for parallel data at one period or plural periods among units having a synchronized clock by the use of a plurality of transmission lines in parallel.

Recently, more broadband transmission has been required, the parallel signal number has increased, and reduction of the signal number of LSI (Large Scaled Integration) has been requested as the input/0 output signal number increases drastically.

So as to respond to this request, for example, as disclosed in High Performance Parallel Interface 6400 M bit/s Physical Layer (HIPPI-6400-PH ANSI X3xxx.199x), it was proposed to transmit a serial data signal at high speed and in broadband by the use of a plurality of transmission lines. So as to correctly receive data that operates at high-speed, it is necessary to sample a data signal having a transmission waveform distorted by a transmission medium such as a cable in a narrow determination region of data called an eye. For that end, phase alteration of a build up or a lagging edge that always alters is supervised constantly, and a sampling clock is regulated at the center of alteration points of data by the use of a PLL (Phase Locked Loop) to receive data. But, in a technique disclosed in this prior-art document, as shown in FIG. 14, by adding one bit to data signal 4 bits, a signal is inversed so that ratios of 1 and 0 become equal, whereby continuous occurrence of 0 and 1 is suppressed to cause alteration to occur constantly.

Also, in a single transmission line, like a fiber channel (ANSI XT11 Fiber Channel Physical and Transmission Protocol) so as to reduce the numbers of 1 and 0 (zero) that are continuous, a technique has been employed of converting 8 bits into 10 bits.

For example, in JP-A-340839/1999, was disclosed a parallel-signal serial transmission unit adapted to provide in the send side separator-bit addition/parallel-serial conversion means of adding a synchronizing signal to a parallel data signal to convert it into a serial data signal, and to provide in the receive side separator-bit deletion/serial-parallel conversion means of removing a separator bit from the serial data signal to convert it into a parallel data signal.

Also, in JP-A-216744/2000, was disclosed a data transmission unit that includes synchronizing code addition means of adding a synchronizing code during a specific period of parallel data and parallel/serial conversion means of converting the parallel data to which the synchronizing code was added into serial data.

On the contrary, in the prior art described above, the problem existed: For example, since separator one bit (or two bits) was added to data 4 bits (or 8 bits), 80% of the transmitted data signal was effective data, whereby, so as to transmit the same data volume, it was necessary to use one and a quarter times of circuit volume and transmission line or to raise a transmission speed one and a quarter times.

Also, since time for converting 4-bit (or 8-bit) data into 5-bit (or 10-bit) one so that ratios of 1 and 0 become equal, and time for converting 5-bit (or 10-bit) data into 4-bit one (or 8-bit one) are needed, the problem existed: It required the time (hereinafter, referred to as latency) that the receiver side recovered original data and output it after data that was transmitted was input, and even though transmission was able to be made at a high speed, the time was delayed for being used as data.

But, in the event that 4 bits (or 8 bits) was not converted into 5 bits (or 10 bits), a redundant bit is not added and a data signal takes a free value, whereby means of establishing a specific signal string as a start of data is not able to be employed, and yet it is not be able to be guaranteed that a signal string does alter into 1 and 0, whereby the problem occurs that a sampling clock is not able to be regulated constantly.

SUMMARY OF THE INVENTION

The present invention is made to solve the above-mentioned problems.

An objective of the present invention is that, in the high-speed transmission system in which a plurality of transmission lines are used; in each transmission line, a parallel data signal sent by the use of a system clock is converted into a serial data signal and transmitted; the data signals that differ in arriving time because they were transmitted in a plurality of transmission lines are sampled with the sampling lock regulated at the center of the data in the receive side; simultaneously a serial data signal is converted into a parallel data signal; and the original data is recovered by synchronizing it with system lock, a ratio of an effective data signal to a transmission data signal is increased without adding redundant bits to the data signal, whereby the maximum transmission capacity is realized by the use of little circuit capacity and low transmission speed, and simultaneously the high-speed transmission system having a low latency in which latency was minimized is provided.

The objectives are achieved by a high-speed transmission system having a low latency comprising a plurality of first transmitter circuits in a send side and a plurality of first data processing circuits in a receive side respectively, said first transmitter circuit and said first data processing circuits having been connected one to one via a transmission line, wherein, so as to regulate a DLL circuit (620) that regulates timing of a sampling clock of a data signal of said first data processing circuit (600), a second transmitter circuit (300), a transmission line (900) and a second data processing circuit (700) are provided, and wherein, when a second specific signal string was sent, a regulation start signal is caused to be distributed from said second data processing circuit (700), and wherein regulation is caused to be made for said DLL circuit (620) by a regulating signal string, and wherein data starting with a bit next to a first specific signal string detected in a data signal for which a serial-parallel conversion was made is written into a FIFO circuit (660), simultaneously a read address synchronized with a system clock (CLKSYS) is generated from a third specific signal string that came to said second data processing circuit (700), and whereby recovery is made for data.

Also, the objectives are achieved by a high-speed transmission system having a low latency comprising a plurality of first transmitter circuits in a send side and a plurality of first data processing circuits in a receive side respectively, said first transmitter circuit and said first data processing circuits having been connected one to one via a transmission line, comprising:

a plurality of first transmitter circuits (200) including:

a n(a multiple of 2)-bit register (210) that receives data with a system clock (CLKSYS) with which the above input parallel was prepared by splitting an input parallel data, or a clock having the same frequency as that of the above system clock (CLKSYS); and parallel-serial conversion circuits (220 and 230) that convert a parallel data signal that is output of said n(a multiple of 2)-bit register (210) into a serial data signal using a clock for transmission having a n/2 multiple frequency, which was synchronized with the system clock (CLKSYS) or a divided clock of said clock for transmission;

when an invalid data string, a regulation signal string that changes surely into 1 and 0, and a first specific signal string comes out at a free or a certain period from said first transmitter circuit (200), so that start times of the invalid data string and a second specific signal string become same and the finish times of the first specific signal string and a third specific signal string become same, a regulation controlling logic circuit (400) that generates the second specific signal string, the regulation signal string that changes surely into 1 and 0, and the third specific signal string;

a second transmitter circuits (300) including:

a n-bit register (310) that receives an output signal of said regulation controlling logic circuit (400) with the system clock (CLKSYS) or a clock having the same frequency as that of the above system clock (CLKSYS); and parallel-serial conversion circuits (320 and 330) that convert a parallel data signal that is output of this n-bit register (310) into a serial data signal using a clock for transmission having a n/2 multiple frequency, which was synchronized with the system clock (CLKSYS), or a de-multiplyed clock of said clock for transmission;

said plurality of data processing circuits (600) including:

a DLL circuit (620) that makes phase comparison between output of the DLL circuit (620) that sets at input the clock for transmission having a n/2 multiple frequency of the system clock (CLKSYS) synchronized the clock for transmission used in said first transmitter circuits (200), and a serial data signal from said first transmitter circuits (200) to regulate a sampling lock so as to have timing at the center of data;

sampler and serial-parallel conversion circuits (630 and 640) that sample a serial data signal from the sampling clock to convert it into a parallel data signal;

a first start-aligned detection circuit (650) that resets a regulation control signal (strt) indicating a regulation start and a regulation finish of said DLL circuit (620) when the regulation start signal comes out, releases a hold of a flip-flop that stored a lead bit position, compares the first specific signal string with a parallel data signal that is output of said serial parallel conversion circuits (630 and 640) that sets the regulation control signal (strt) in the event that they accorded when the regulation control signal (strt) was reset, and stores and holds the lead bit position;

an alignment circuit (650) that invalidates output with the regulation control signal (strt) reset by this first start-aligned detection circuit (650), and, according to storage result of the lead bit position of said first start-aligned detection circuit (650) when the regulation control signal (strt) was set in said first start-aligned detection circuit (650), outputs n bits starting with a bit next to the signal string, that accorded, as data every n bits;

a write address generation circuit (661) that stops when the regulation control signal (strt) of said first start-aligned detection circuit (650) is a reset, and generates write addresses that circulate starting with the address 0 until the address (m−1) when it is a set;

a m-address n-bit FIFO circuit (660) that sequentially writes the output of said alignment circuit (650) into the designated address according to the output of this write address generation circuit (661);

a m-way n-bit multiplexer (670) selects a data signal of the address designated by the read address written in said m-address n-bit FIFO circuit (660), being synchronized with the system clock (CLKSYS); and a n-bit register (680) that writes the output of this m-way n-bit multiplexer (670);

a second data processing circuit (700) that is configured of:

a DLL circuit (720) that makes phase comparison between the output of the DLL circuit (720) that sets at the input the clock for transmission having a n/2 multiple frequency of the system clock (CLKSYS) synchronized with the clock for transmission used in said second transmitter circuits (300), and a serial data signal from said second transmitter circuits (300) to regulate a sampling clock so as to have sampling timing at the center of data;

sampler and serial-parallel conversion circuits (730 and 740) that sample a serial data signal with a sampling clock to convert it into a parallel data signal;

a second start-aligned detection circuit (750) that compares the output of said sampler and serial-parallel conversion circuits (730 and 740) with the second specific signal string, prepares a regulation start signal with a given pulse width indicating regulation of said DLL circuit (720) when they accorded, distributes it to said first data processing circuit (600), resets a regulation finish signal, compares the output of said serial-parallel conversion circuits (730 and 740) with a third specific signal string, and sets a regulation finish signal when they accorded;

a synchronizing circuit (760) that synchronizes the regulation finish signal with the system clock (CLKSYS) and outputs a read address start signal at such timing that the read address start signal is output after the output of said alignment circuit (650) was written into said m-address n-bit FIFO circuit (660) and yet before the next data is written into the same address in said m-address n-bit FIFO circuit (660) of said plurality of said first data processing circuits (600);

a read address generation circuit (770) that stops when the read address start signal from this synchronizing circuit (760) is reset, and distributes the read addresses that is sequentially generated in circulation of the address 0 to the address (m−1), and yet simultaneously designate the same address for a plurality of said m-address n-bit FIFO circuits (660) of said first data processing circuit (600) when a read address start signal from this synchronizing circuit (760) is set.

Means for solving the tasks in the high-speed transmission system having a low latency of the present invention and features of the present invention will be illustrated, referring to FIG. 1 and FIG. 2.

The high-speed transmission system having a low latency of the present invention is characterized by adding to a high-speed transmission system comprising: a plurality of transmission lines 800; in the send side, a plurality of first transmitter circuits 200 that are configured of: a n-bit register 210 that receives data with a system clock CLKSYS with which the above input parallel signal was prepared by splitting the input parallel signal, or a clock having the same frequency; parallel-serial conversion circuits (n/2:1 multiplexer 220 and 2:1 multiplexer 230) that convert the output of the n-bit register 210 into the serial data signals using a clock for transmission with a n/2 multiple frequency, which was synchronized with the system clock CLKSYS, or a divided clock of the clock for transmission; a pre-emphasis control circuit 230 (hereinafter, plural circuits that are illustrated in the same block of the drawing will be explained with the identical symbol mark added.) that controls a pre-emphasis function of increasing output amplitude of a driver 240 when the data signal is different from one that is ahead one data portion, and of reducing it when it is the same; and the driver 240 that generates the data signal pre-emphasized according to the output of pre-emphasis control circuit 230, in the receive side, a plurality of first data processing circuits 600 that is configured of: a DLL (Delay Locked Loop) circuit 620 that is one kind of PLL (Phase Locked Loop) circuits, which compares with the data signal the output of the DLL circuit 620 that sets at the input the clock for transmission having a n/2 multiple frequency of the system clock CLKSYS synchronized with the clock for transmission used in the first transmitter circuits 200, and regulates the sampling clock so as to keep the sampling timing at the center of the data; sampler and serial-parallel conversion circuits (sampler and 1:2 de-multiplexer 630 and 1:n 2 de-multiplexer 640) that sample the serial signal with the sampling clock to covert it into the parallel signal; a first start-aligned detection circuit 650 that, resets a regulation control signal strt instructing a regulation start and a regulation finish of the DLL circuit 620 when a regulation start signal came, releases a hold of a flip-flop that stored a lead bit position, compares a first specific signal string with the output of the serial-parallel conversion circuit, sets the regulation control signal strt in the event that they accorded when the regulation control signal strt was reset, and stores and holds the lead bit position; a alignment circuit 650 that invalidates the output by the reset regulation control signal strt, and outputs as data n bits starting with the bit next to the signal string, which accorded, every n bits when the regulation control signal strt was reset, according to the storage result of the lead bit position of the first start-aligned detection circuit 650; a write address generation circuit 661 (refer to FIG. 10) that stops when the regulation control signal strt is a reset, and generates a write address that circulates from the address 0 to the address (m−1) when it is a set; a m-address n-bit FIFO circuit 660 that sequentially writes the output of the alignment circuit 650 into the designated address according to the output of the write address generation circuit 661; a m-way n-bit multiplexer 670 that selects the data signal of the address designated by the read address written in the m-address n-bit FIFO circuit 660, being synchronized with the system clock CLKSYS; and a n-bit register 680 that writes the output of the m-way n-bit multiplexer 670, a transmitter circuit 300 including: when an invalid data string, a regulation signal string that changes surely into 1 and 0, and a first specific signal string come out from the first transmitter circuit 200, a regulation controlling logic circuit 400 that generates the second specific signal string, the regulation signal string that changes surely into 1 and 0, and the third specific signal string so that the start times of the invalid data string and the second specific signal string become same and the finish times of the first specific signal string and the third specific signal string become same; a n-bit register 310 of which a circuit configuration is the same as that of the first transmitter circuit 200, which receives the output signal of the regulation controlling logic circuit 400; parallel-serial conversion circuits (n/2:1 multiplexer 320 and 2:1 multiplexer 330) that convert the output of the n-bit register 310 into the serial data signal; a pre-emphasis control circuit 330 that controls a pre-emphasis function of increasing output amplitude of a driver 340 when the data signal is different from one that is ahead one data portion and of reducing it when it is the same; and the driver 340 that generates the data signal pre-emphasized according to the output of pre-emphasis control circuit 330; a second data processing circuit 700 that is configured of: a DLL circuit 720 and sampler and serial-parallel conversion circuits (sampler and 1:2 de-multiplexer 730 and 1:n de-multiplexer 740) in a similar manner to the first data processing circuit 600; a second start-aligned detection circuit 750 that compares the output of the sampler and serial-parallel conversion circuits with the second specific signal string, when they accorded, prepares the regulation start signal with a given pulse width instructing regulation of the DLL circuits 620 and 720 to distribute it to the first data processing circuit 600, resets the regulation finish signal, compares the output of the serial-parallel conversion circuits with the third specific signal string, and, when they accorded, sets the regulation finish signal; a synchronizing circuit 760 that synchronizes the regulation finish signal with the system clock CLKSYS, and outputs a read address start signal that matches timing of generating the read address at such timing that the read address is generated after the output of the alignment circuit 650 was written into the m-address n-bit FIFO circuit 660 and yet before the next data is written into the same address in the m-address n-bit FIFO circuit 660 of all first data processing circuits 600; and a read address generation circuit 770 that stops when the read address start signal from the synchronizing circuit 760 is reset, and distributes the read address that sequentially occurs in circulation of the address 0 to the address (m−1) when the read address start signal from the synchronizing circuit 760 is set, and yet simultaneously designates the same address to a plurality of the m-address n-bit FIFO circuits 660 of the first data processing circuit 600.

In the clock for transmission having a n/2 multiple frequency, which was synchronized with the system clock CLKSYS, the system clock CLKSYS or the signal having the same or a 1/integral frequency, which has a certain phase relation with the system clock CLKSYS is set at the REF clock (reference clock), an analogue PLL circuit is used that generates the clock for transmission having a n/2 multiple frequency of the system clock CLKSYS, which has the same phase as that of the system clock CLKSYS every n/2 period, as shown in FIG. 1, a first analogue PLL circuit 100 in the send side and a second analogue PLL circuit 500 in the receive side are provided, and the clock for transmission is distributed to the circuits that require it in each of the send side and receive side.

Also, like a high-speed transmission system with a source-synchronous technique having a low latency shown in FIG. 2, the second analogue PLL circuit 500 may be omitted, the clock for transmission is transmitted from the first analogue PLL circuit 100 to the receive side via the driver 140, the transmission line 1000, and the receiver 540 and is distributed to the first data processing circuit 600 and the second data processing circuit 700.

In such a configuration, for the data signal, which does not possess the redundant bit in the data signal string, for which means of establishing a specific signal string as the start of the data so that a free value is taken can not be employed, and of which alteration into 1 and 0 is not guaranteed, when the invalid data string, the regulation signal string that changes into 1 and 0 surely, and the first specific signal string come out, the second transmitter circuit 300 is caused to output the second specific signal string (even though it is one bit, it should be considered that it became 1), the regulation signal string, and the third specific signal string, and the first transmitter circuit 200 is caused to output the invalid data string, the regulation signal string, and the first specific signal string at a certain or a free period so that the start times of the invalid data string and the second specific signal string become the same and the finish times of the first specific signal string and the second specific signal string become the same, whereby, if the second specific signal string came, the second data processing circuit 700 prepares the regulation start signal of the DLL circuit 620 to make the regulation by the DLL circuit 620 of the sampling clock among the second specific signal string, the regulation signal string and the third specific signal string, to stop generation of the read address of the m-address n-bit FIFO circuit 660 within the second data processing circuit 700, to simultaneously distribute the regulation control signal strt to the first start-aligned detection circuit 650 of the first data processing circuit 600, thereby to release the hold, to reset the stored lead bit position, to reset the regulation finish signal, thereby to cause the m-address n-bit FIFO circuit 660 to stop generation of the write address, to cause the output of the alignment circuit 650 to be invalidated, to cause the input of the regulation signal string, which enables the regulation of the DLL circuit 620, to be allowed, yet to cause the DLL circuit 620 to make the regulation of the sampling lock, furthermore, in every first data processing circuit 600, if the first specific signal string was input into the data signal during the regulation period of the DLL circuit 620, to cause each first data processing circuit 600 to recognize it as the signal that is set at the regulation finish and the data start, whereby the bits starting with the bit next to the first specific signal string is able to be sequentially written into the addresses of the m-address n-bit FIFO circuit 660 starting with the address 0.

Also, when the third specific signal string came to the second data processing circuit 700 the almost same time that the first specific signal string came to the first data processing circuit 600, the read addresses are generated that recognize it as the regulation finish, prepare the read address start signal, are synchronized with the system clock CLK-SYS, and occur sequentially in circulation of the address 0 to the address (m−1), and are distributed to the first data processing circuit 600, whereby, in each m-address n-bit FIFO circuit 660, the data, which was written at random due to a variation of the transmission lines 800 and a variation of the circuits is caused to be read out from the same address simultaneously and yet by synchronizing it with the system clock CLKSYS, whereby the parallel data signal string recovered from the send-side parallel data signal string can be obtained.

Herein, the invalid data string that is output from the first transmitter circuit 200 at the time of the regulation start may be only a specific bit indicating effectiveness of the data. The number of the invalid data may be acceptable, if it exceeds the period that is obtained by subtracting the time that the invalid data string is input into the first data processing circuit 600 and then is input into the alignment circuit 650 from the time that the second specific signal string is input into the second data processing circuit 700, the regulation start signal is generated, and the data of the alignment circuit 650 of the first data processing circuit 600 is invalided.

Also, as shown in FIG. 2, the clock for transmission is distributed from the send side to the receive side, whereby, also in transmission among the units that used the system clocks CLKSYS of which the frequencies differ because the system clocks CLKSYS of which the clock sources differ are used, even though the difference might be minute, the data is periodically re-regulated before the data would be lost, whereby transmission without any error can be realized.

BRIEF DESCRIPTION OF THE DRAWINGS

This and other objects, features and advantages of the present invention will become more apparent upon a reading of the following detailed description and drawings, in which;

FIG. 3 is a diagram illustrating a specific example and a time chart of a 2:1 multiplexer and register that is one component of an n/2:1 multiplexer in a first and a second transmitter circuits in FIG. 1 and FIG. 2;

FIG. 4 is a diagram illustrating a specific example and a time chart of a 2:1 multiplexer and pre-emphasis control circuit and a driver in a first and a second transmitter circuits in FIG. 1 and FIG. 2;

FIG. 7 is a diagram illustrating a specific example and a time chart of a 1:4 de-multiplexer that is one component of a 1:n de-multiplexer in a first and a second date processing circuits in FIG. 1 and FIG. 2;

DESCRIPTION OF THE EMBODIMENTS

Hereinafter, so as to clarify the above-mentioned and other objectives, features and advantages of the present invention, embodiments of the present invention will be explained in details, referring to the accompanied drawings.

(1) First Embodiment

Figure 1:
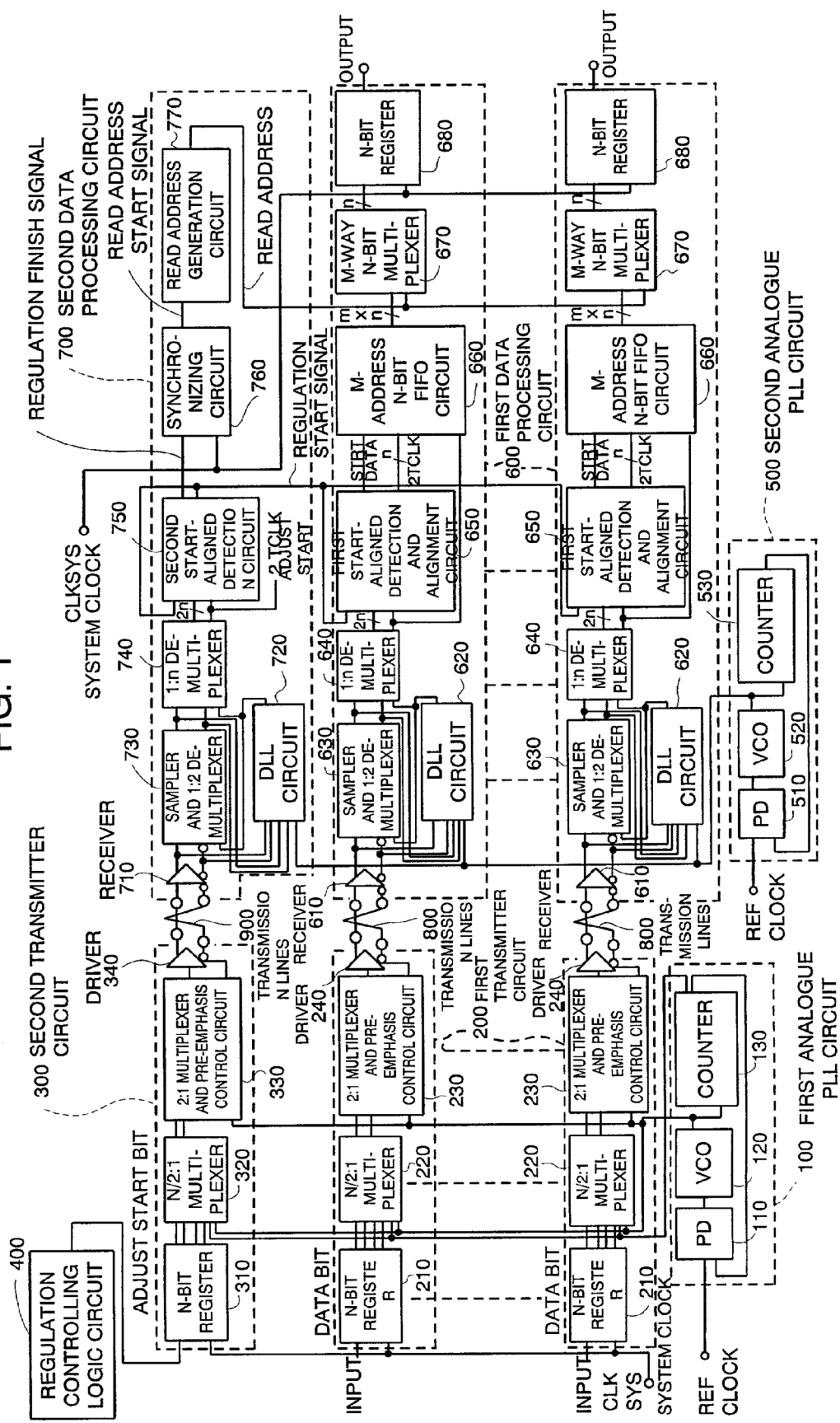
FIG. 1 is a circuit block diagram illustrating a configuration of a high-speed transmission system with a synchronous clock technique having a low latency relating to a first embodiment of the present invention.

FIG. 1 is a circuit block diagram illustrating a high-speed transmission system with a synchronous clock technique having a low latency relating to a first embodiment of the present invention. In the high-speed transmission system having a low latency relating to this embodiment, the send side including a first analogue PLL circuit 100, a plurality of first transmitter circuits 200, a second transmitter circuit 300, and a regulation controlling logic circuit 400, and the receive side including a second analogue PLL circuit 500, a plurality of first data processing circuits 600, a second data processing circuit 700 are connected via a plurality of transmission lines 800 and a transmission line 900, and its main components are configured.

Figure 13:
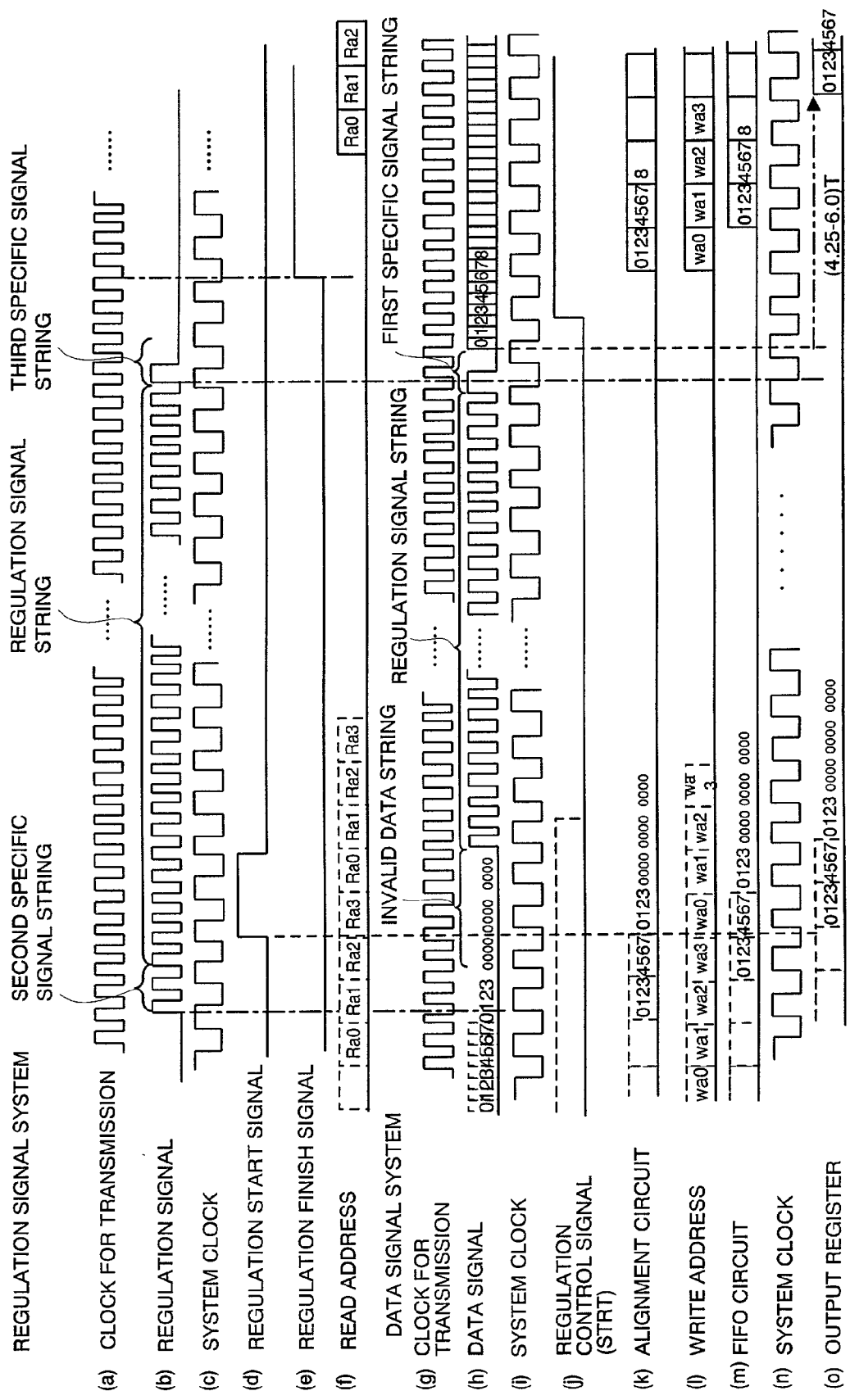
FIG. 13 is a time chart exemplifying various signals of the regulation period in a high-speed transmission system having a low latency relating to this embodiment.
Figure 14:
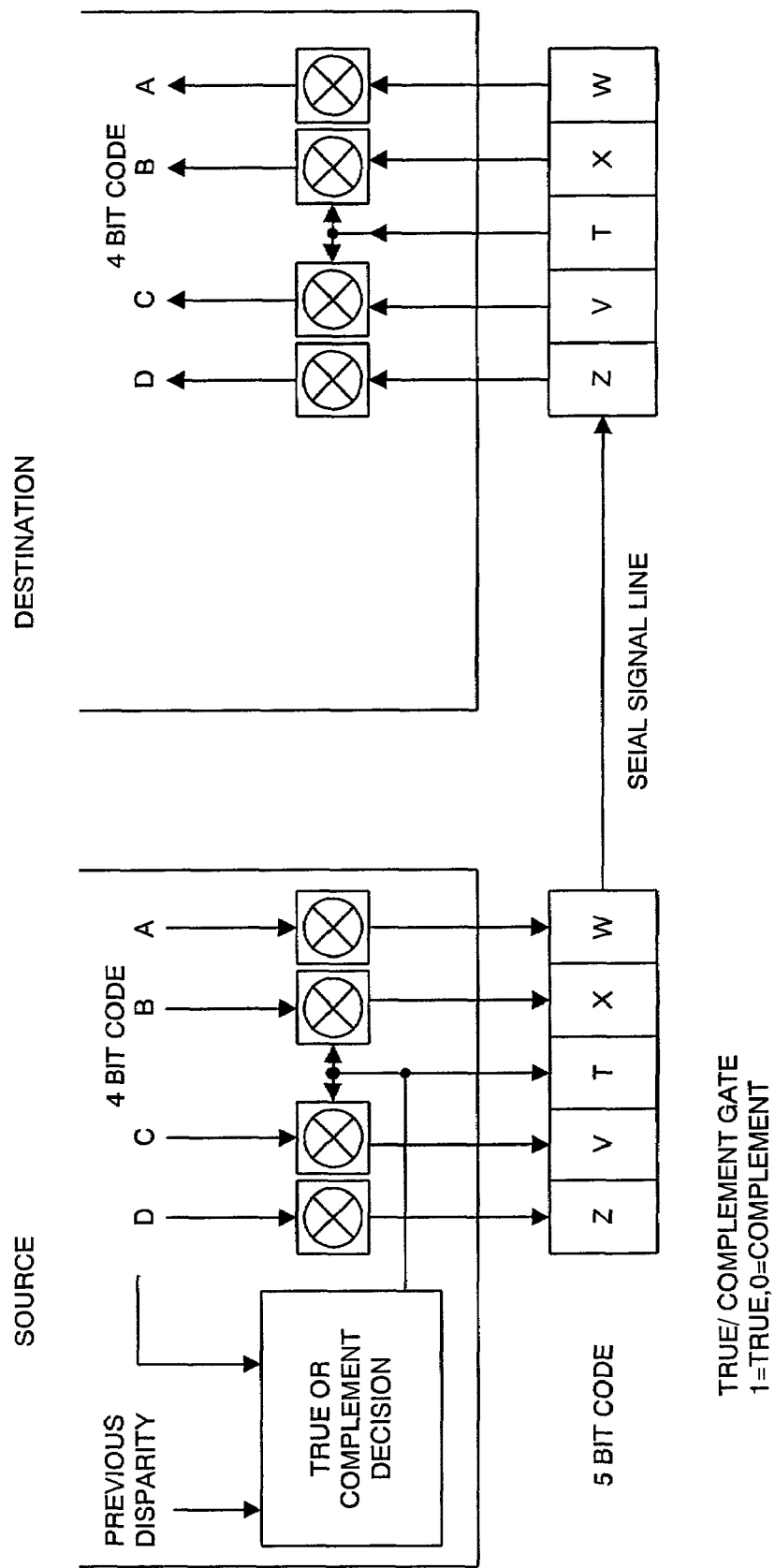
FIG. 14 is a diagram exemplifying conventional code conversions.

The first analogue PLL circuit 100 is configured of a voltage regulation-type variable frequency oscillator (VCO) 120 that oscillates at a n/2 multiple frequency of the system clock CLKSYS to output the clock for transmission(refer to FIG. 13 (g)), a counter 130 that divides so that the output becomes the same frequency as the REF clock when the output, which is the output of first analogue PLL circuit 100, is a n/2 multiple frequency of the system clock CLKSYS (refer to FIG. 13 (i)), and a phase comparator (PD) 110 that makes phase comparison between the output of the counter 130 and the REF clock to control the control voltage of the VCO 120 so that the frequency and the phase of the output of the counter 130 becomes equal to that of the REF clock. Herein, the position of the clock for transmission, which is the clock input of the counter 130, is obtained from the clock input of the flip-flop of the 2:1 multiplexer 230, whereby the phase of the system clock CLKSYS and the clock for transmission can be kept at a certain relation.

The first transmitter circuit 200 is configured of: a n-bit register 210 that receives the split n-bit parallel data signal of the input parallel data signal sent from the logic side (not shown) from the clock having the same frequency as that of the system clock CLKSYS that is the output of the counter 130 of the first analogue PLL circuit 100 or the system clock CLKSYS; parallel-serial conversion circuits (n/2:1 multiplexer 220 and 2:1 multiplexer 230) that convert the output of the n-bit register 210 into the serial data signal (refer to FIG. 13 (h)), using the clock for transmission from the first analogue PLL circuit 100; a pre-emphasis control circuit 230 that controls a pre-emphasis function of increasing the output amplitude of a driver 240 when the data signal is different from one that is ahead one data portion and of reducing it when it is the same; and the driver 240 that generates the data signal pre-emphasized according to the output of the pre-emphasis control circuit 230.

The second transmitter circuit 300, which has the same circuit configuration as that of the first transmitter circuit 200, is configured of: a n-bit register 310 that receives the n-bit parallel data signal sent from a regulation controlling logic circuit 400; parallel-serial conversion circuits (n/2:1 multiplexer 320 and 2:1 multiplexer 330) that convert the output of the n-bit register 310 into the serial data signal, using the clock for transmission from the first analogue PLL circuit 100; a pre-emphasis control circuit 330 that controls a pre-emphasis function of increasing the output amplitude of a driver 340 when the data signal is different from one that is ahead one data portion and of reducing it when it is the same; and the driver 340 that generates the data signal pre-emphasized according to the output of pre-emphasis control circuit 330.

When the invalid data string, the regulation signal string that changes into 1 and 0 surely and the first specific signal string come from the first transmitter circuit 200 at a certain or a free period, the regulation controlling logic circuit 400 generates the second specific signal string, the regulation signal string, and the third specific signal string so that the start times of the invalid data string and the second specific signal string become the same and the finish times of the first specific signal string and the third specific signal string become the same. Hereinafter, in this embodiment, as shown in FIG. 13, the invalid data string is to be "0 . . . 0" (refer to FIG. 13 (h)), the regulation signal string "10 . . . 10" (refer to FIGS. 13 (b) and (h)), the first specific signal string "1100" (refer to FIG. 13(h)), the second specific signal string "1010" (refer to FIG. 13 (b)), and the third specific signal string "1100" (refer to FIG. 13 (b)). The regulation controlling logic circuit 400 sends the second specific signal string and the regulation signal string to the second transmitter circuit 300 at the time of the regulation start, sends the third specific signal string at the time of the regulation finish, and sends the invalid signal at the other time than these, being synchronized with the first transmitter circuit 200. The invalid signal may be all 0. Also, the invalid data string, the regulation signal string and the first specific signal string are adapted to be output from the first transmitter circuit 200 to the data signal, and establishment is made so that the first and last times accord.

The second analogue PLL circuit 500, which has the same circuit configuration as that of the first analogue PLL circuit 100, is configured of a PD 510, a VCO 520 and a counter 530, prepares the clock for transmission having a n/2 multiple frequency, which was synchronized with the system clock CLKSYS, and distributes it to the first data processing circuit 600 and the second data processing circuit 700. In the second analogue PLL circuit 500, the REF clock has the same frequency as that of the REF clock used in the first analogue PLL circuit 100.

The first data processing circuit 600 is configured of a receiver 610, a DLL circuit 620, a sampler and 1:2 de-multiplexer 630, a 1:n de-multiplexer 640, a first start-aligned detection circuit and alignment circuit 650, a m-address n-bit FIFO circuit 660, a m-way n-bit multiplexer 670, and a n-bit register 680.

The second data processing circuit 700, which has a function of taking control for the first data processing circuit 600, is configured of a receiver 710, a DLL circuit 720, a sampler and 1:2 de-multiplexer 730, a 1:n de-multiplexer 740, a second detection circuit and alignment circuit 750, a synchronizing circuit 760, and a read address generation circuit 770. Additionally, the receiver 710, the DLL circuit 720, the sampler and 1:2 de-multiplexer 730, the 1:n de-multiplexer 740 have the same configuration and function as that of the receiver 610, the DLL circuit 620, the sampler and a 1:2 de-multiplexer 630, the 1:n de-multiplexer 640 in the first data processing circuit 600 respectively.

Next, an operation of high-speed transmission system having a low latency relating to the first embodiment configured in such a manner will be explained in details.

The first analogue PLL circuit 100 sets at the REF clock input the system clock CLKSYS or the signal having the same or a 1/integral frequency, which has a certain phase relation with the system clock CLKSYS, and generates the clock for transmission having a n/2 multiple frequency of the system clock CLKSYS, which comes to have the same phase as that of the system clock CLKSYS every n/2 period. The clock for transmission is used for converting the parallel data signal, which was split into a plurality of n-bits, into the n-bit serial data signal The n-bit register 210 receives the split n-bit parallel data signals of the input parallel data signal sent from the logic side (not shown) by synchronizing it with the clock having the same frequency as that of the system clock CLKSYS, or the system clock CLKSYS.

The parallel-serial conversion circuit, which comprises the n/2:1 multiplexer 220 and the 2:1 multiplexer 230, converts the n-bit parallel data signal into the serial data signal.

Since, so as to transmit all 0 and all 1, transmission is impossible to make with an AC coupling, the pre-emphasis control circuit 230 is necessary for keeping and transmitting the direct component. Namely, so that the waveform of which the build-up time at the receive end was quickened by increasing the output amplitude when the negative data signal that is ahead one data portion is equal to the transmitting data signal (i.e. when it alters), and of which the output amplitude was increased at the time when the negative data signal that is ahead one data portion is equal to the transmitting data signal when it is different (i.e. when it does not alter) reaches the receive end, and further its voltage becomes the voltage at the moment that one data period portion was delayed, the pre-emphasis control circuit 230 changes output impedance of the driver 240, and causes the direct voltages split by the transmission-system direct resistance and the receive-end terminal resistance to become equal. By taking the pre-emphasis control, also in the event that all 0 or all 1 continues and the amplitude does not reach the normal status at the time of the build up or the lagging edge, the alteration occurs constantly, and also in the event that the signal in the high-frequency band attenuates due to frequency characteristics of the transmission line 800, resulting in the amplitude becoming small, each voltage just before the voltage alters at the receive end can be kept at a constant level end and yet the amplitude at the time of the alteration also can be kept at a constant level, whereby the determined region (eye) of the transmitted data signal can be increased. Also, pre-emphasis quantity including no pre-emphasis is caused to be selectable by preparing a plurality of pre-emphasis quantity, whereby selection becomes possible responding to attenuation quantity of the transmission line 800 including attenuation quantity in not only a cable but also a printed circuit. By doing so, in a similar manner to a cable with an equalizer, not only optimization of the cable but also optimization that responded to the entire attenuation quantity of the transmission line 800 can be realized.

The driver 240 makes transmission via the transmission line 800 while emphasizes the serial data signal.

In the receive side, the DLL circuit 620 makes phase comparison between the delayed clock of the clock for transmission, which is the output of the second analogue PLL circuit 500, and the serial data signal, and regulates the sampling clock CK1 (refer to FIG. 5) by controlling its delay time so as to sample the center of the data at the build up and the lagging edge. The data signals output simultaneously from the send side reach at different delay times due to variation of the transmission lines 800 and the circuits in passing through each transmission line 800. But so as to receive the data correctly, it is important to make sampling at the center of the eye, and the phase of the sampling clock CK1 is regulated by the DLL circuit 620 so that sampling is made at the center of the eye every data signal.

The sampler and 1:2 de-multiplexer 630 samples two data with the leading edge and the back edge of the sampling clock CK1 at the center of the input parallel data, and simultaneously outputs two parallel data signals sampled by unifying the timing of the output with the back edge of the sampling clock CK1.

The 1:n de-multiplexer 640 alternately samples two kind of the output from the sampler and 1:2 de-multiplexer 630 further every n-bit and every same period as that of the system clock CLKSYS to prepare the parallel data signal that alters at the two-time period of the system clock CLKSYS.

The first start-aligned detection circuit 650: indicates that the DLL circuit 620 is under regulation by resetting when the regulation control signal strt that is the output thereof is effective; prepares the regulation control signal strt indicating the regulation finish by setting when the first specific signal string is detected in the output of the 1:n de-multiplexer 640 during regulation of the DLL circuit 620; indicates the regulation finish by setting the regulation control signal strt if the first specific signal string is detected when the regulation control signal strt is reset and that the DLL circuit 620 is under regulation is indicated; and stores and holds the lead bit position.

When the output was invalidated by resetting the regulation control signal strt, and the regulation control signal strt was set, the alignment circuit 650 outputs n bits starting with the bit next to the signal string, which accorded, every n bits according to the storage result of the lead bit position of the first start-aligned detection circuit 650.

The m-address n-bit FIFO circuit 660 stops the write address at the reset time that the regulation control signal strt indicates that the DLL circuit 620 is under regulation by setting at the start signal the regulation control signal strt from the first start-aligned detection circuit 650, generates the write addresses in circulation of the address 0 to the address (m−1) in the next cycle and more at the set time that the regulation control signal strt indicates that the regulation of the DLL circuit 620 is over, and writes the output data of the first start-aligned detection circuit 650 starting with the n bits next to the first specific signal string according to this write address.

The m-way n-bit miltiplexer 670 selects and fetches the n-bit data written in the m-address n-bit FIFO circuit 660 according to the read address from the read address generation circuit 770.

The n-bit register 680 writes and outputs the n-bit output data of the m-way n-bit miltiplexer 670 into the system clock CLKSYS.

Next, specific examples of each circuit will be explained in more detail by the use of FIG. 3 to FIG. 12.

Firstly, referring to FIG. 3, a specific example of the n/2:1 multiplexer 220 will be explained.

A 2:1 multiplexer and register 221 shown in FIG. 3 is one component of the n/2:1 multiplexer 220, and the n/2:1 multiplexer 220 is configured by continuously connecting the 2:1 multiplexer and registers 221 in such a manner that flip-flops F30 and F31 in the former-step of the first step are set at the n-bit register and a flip-flop F32 of the 2:1 multiplexer and register 221 is set at the former-step register in the second step and more. The n/2:1 multiplexer 220 inputs two kinds of the output into the 2:1 multiplexer 230.

A plurality of the 2:1 multiplexer and registers 221 play a role for the parallel-serial conversion function, which are configured of: a selector S0 that sets 2 bits of the former-step flip-flops F30 and F31 at the input, sets the clock CK30 of the former-step flip-flops F30 and F31 at the selection signal, selects the output of the flip-flop F30 for a first half period of the clock CK30, and selects the output of the flip-flop F31 for the remaining half period of the clock CK30; and the flip-flop F32 having a 2 multiple frequency of the clock CK30, which samples the output of the selector S0 with the edge of a clock CK31 that is different from the sampling edge of the clock CK30.

The sampling clock CK30 of the former-step flip-flops F30 and F31 for use in the 2:1 multiplexer and register 221, and the clock CK31 having a 2 multiple frequency are obtained from the output of the VCO 120 of the first analogue PLL circuit 100 and the output of the counter 130.

In such a configuration of the n/2:1 multiplexer 220, the half period of the former-step clock CK30 is apart 180° back and forth, being viewed from the effective edge of the clock CK31 having a 2 multiple frequency, whereby sampling can be made with room left sufficiently.

Next, referring to FIG. 4, a specific example of the 2:1 multiplexer 230 will be explained.

The specific example of the 2:1 multiplexer 230 is configured of selectors S40 and S41 that set at the selection signal a sampling clock CK41 adapted so that the sampling edge of flip-flops F40 and F41 of the n/2:1 multiplexer 220 becomes the back edge, select the positive output and the negative output of the flip-flop F40 for a former-half period of the sampling clock CK41, select the positive output and the negative output of the flip-flop F42 for a latter-half period of the sampling clock CK41, and switch and output each.

In such a configuration of the 2:1 multiplexer 230, the output of the flip-flop F40 alters more slowly than the back edge of the sampling clock CK41, whereby, when the sampling clock CK41 selects the output of the flip-flop F40, it is guaranteed that the output of the flip-flop F40 does not alter, and the output of the flip-flop F42 alters more slowly than the leading edge of the sampling clock CK41, whereby, when the sampling clock CK41 selects the output of the flip-flop F42, it is guaranteed that the output of the flip-flop F42 does not alter, whereby the effect is obtained of no possibility that the waveform alters after selecting.

Next, referring to FIG. 4, a specific example of the pre-emphasis control circuit 230 will be explained.

The specific example of the pre-emphasis control circuit 230 is configured of: a flip-flop F43 that sets the leading edge of the sampling clock CK41 at the sampling edge, and samples and fetches the positive output of the flip-flop F40 of the n/2:1 multiplexer 220; a flip-flop F44 that samples and fetches the positive output of the flip-flop F41 with back edge of the sampling clock CK41 and yet in the next cycle; and selectors S42 and S43 that select the positive output and the negative output of the flip-flops F43 and F44 by setting the inverse signal of the sampling clock CK41 as the selection signal, and obtains the positive output and the negative output of the flip-flop F44 for a former-half period, and the positive output and the negative output of the flip-flop F43 for a latter-half period.

In the pre-emphasis control circuit 230, the signal of the sampling clock CK4, which was by half-period portion delayed, i.e. the data signal, which is by one data portion ahead, is obtained from the output of the selectors S40 and S41 that select the output of the flip-flops F40 and F42. The output impedance of the driver 240 is caused to alter and the direct voltages split by the transmission-system direct resistance and the receive-end terminal resistance are caused to become equal so that, when this negative data signal that is by one data portion ahead is equal to the transmitting data signal (i.e. when alteration occurs), the build-up time at the receive end is quickened by increasing the output amplitude and when it is different (i.e. when alteration does not occur), the waveform, of which the output amplitude at the moment when this negative data signal that is by one data portion ahead is equal to the transmitting data signal reaches the receive end and its voltage becomes the voltage at the moment when one data-period portion was delayed.

Figure 5:
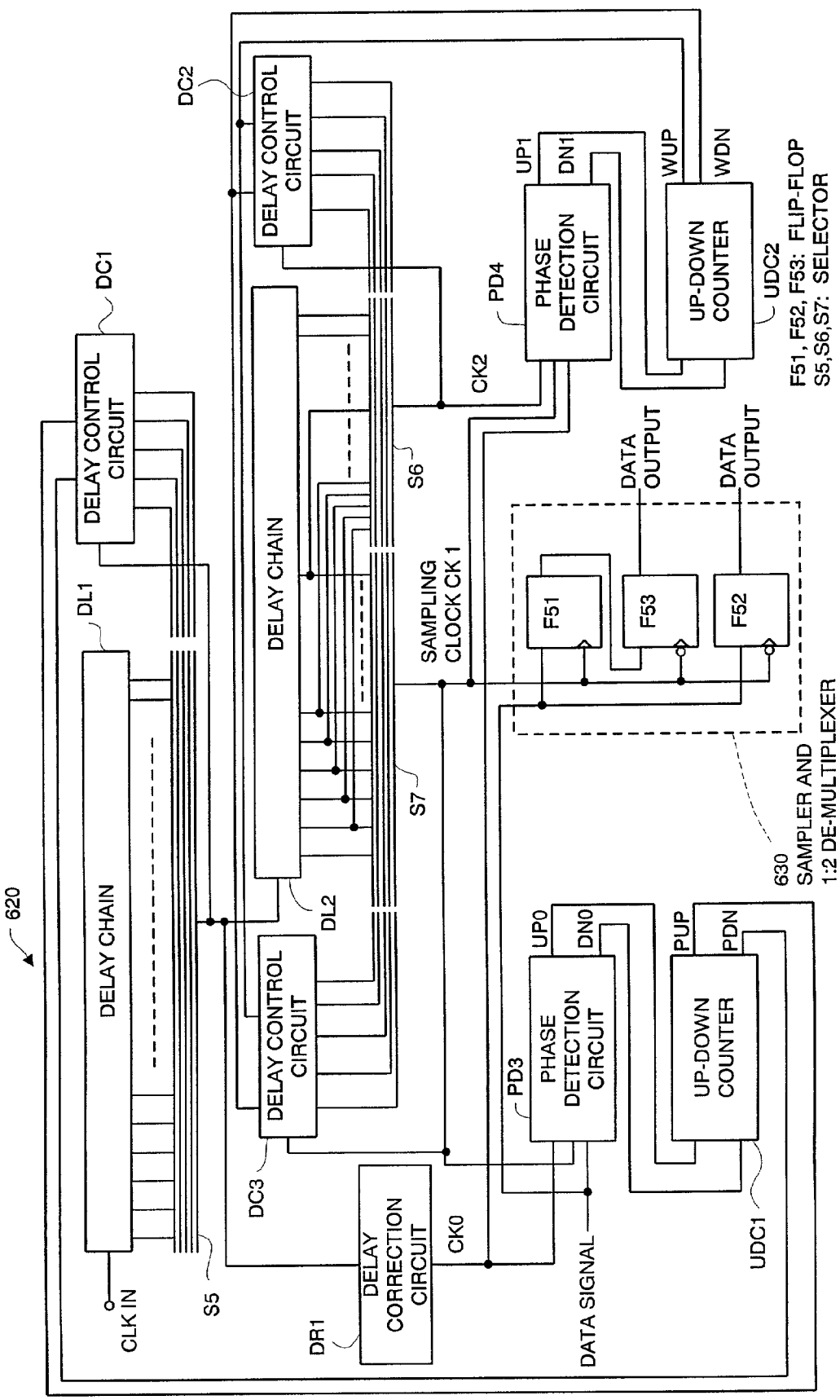
FIG. 5 is a diagram illustrating a specific example of a DLL circuit and a sampler and 1:2 de-multiplexer in a first and a second date processing circuits in FIG. 1 and FIG. 2.

Next, referring to FIG. 5, a specific example of the DLL circuit 620 will be explained.

The specific example of the DLL circuit 620, which is for regulating the sampling clock CK1 at the center of the eye that is the determination region of the data signal, is configured of: two delay chains DL1 and DL2; two phase detection circuits PD3 and PD4; two up-down counters UDC1 and UDC2; three delay control circuits DC1, DC2 and DC3; and a delay correction circuit DR1.

A clock for transmission CLK in that is the output of the second analogue PLL circuit 500 is input into the delay chain DL1, the delay control circuit DC1 instructs to select the clock of a tap, which has a larger or a smaller delay time of the delay chain DL1, on every tap every time a delay signal (pup) or an advance signal (pdn) exists, according to instruction of the delay (pup) or the advance (pdn) by the up-down counter UDC1, and a selector S5 selects and outputs the clock of the instructed tap.

The output of the selector S5 causes the delay control circuit DC1 to operate as the clock, simultaneously is input into the delay chain DL2, and furthermore is input into the delay correction circuit DR1 that prepares a clock CK0 that was delayed by the time equal to the delay time of the selectors S6 and S7.

Also, a plurality of the tap output having a minute delay time difference of the delay chain DL2 causes the delay control circuit DC2 to instruct to select the clock of the tap, which has a larger or a smaller delay time of the delay chain DL2, on every tap every time the delay signal (wup) or the advance signal (wdn) exists, according to the instruction of the delay (wup) or the advance (wdn) by the up-down counter UDC2, selection is made by the selector S6 based on the instructed result, and the clock CK2 is output.

The delay control circuit DC3, which has the up-down counter in the exterior thereof, repeats the up or the down every time the delay signal (wup) or the advance (wdn) signal exists, selects the clock of the tap, which has a larger or a smaller delay time of the delay chain DL2, every tap every time each of them is two more than the other, instructs to select the tap so that the delay becomes an intermediate delay between the clock CK0 and the clock CK2, and, the sampling clock CK1 is selected by a selector S7 based on the instructed result.

The phase detection circuit PD3: compares the result of the alteration point of the input data signal sampled via the receiver 610 with leading edge or the back edge of the clock CK0 from the delay correction circuit DR1 with the sampling result at the determination point before and after the alteration point that is the result sampled with the leading edge or the back edge of the clock CK1 at the determination point of the same input data; determines that the alteration point of the data signal is quick to output the advance signal (dn0) when it is different from the result at the data determination point that was obtained just before; and determines that the alteration point of the data signal is slow to output the delay signal (up0) when it is different from the result at the data determination point that was obtained just after. This advance signal (dn0) and delay signal (up0) are input into the up-down counter DC1, and the instruction of the advance (pdn) or the delay (pup) is sent to the delay control circuit DC1 at the moment that the number of each of the advance signal (dn0) and the delay signal (up0) became much than that of the other by a certain number.

Herein, since the result sampled with the leading edge or the back edge of the sampling clock CK1 at the determination point of the input data signal is the same as the result sampled with the leading edge or the back edge of the sampling clock CK1 in the sampler and 1:2 de-multiplexer 630, the output of the sampler and 1:2 de-multiplexer 630 may be used.

By adding the up-down counter UDC1, also in the event that the phase alters temporarily due to noise, waveform distortion and so forth, it is determined by averaging whether it delays or advances, whereby improper instructions can be reduced. Also, due to the up-down counter UDC1, the instruction of the advance (pdn) or the delay (pup) is issued to the delay control circuit DC1 after more than a certain time elapsed, whereby the time can be delayed that the next instruction is issued since the instruction of the advance (pdn) or the delay (pup) was once issued to the delay control circuit DC1, the time can be kept that is necessary for the next instruction to the delay control circuit DC1 being prepared, based on its result, since the next phase detection was made by the use of the clock of its selection result after alteration occurred in the delay control circuit DC1, and an overshoot can be prevented at the moment that the phases came to be equal.

The phase detection circuit PD4, which is a circuit that compares the result sampled with the clock CK2 that delayed by approximately a half-period the phase of the clock CK0 that was delayed 180°, which became the alteration point, with the result sampled with the sampling clock CK1 having a half delay time of the clock CK2 at the determination point of the clock CK0, compares the result of the sampling at the determination point before and after the alteration point with the sampling result at the alteration point, and outputs the advance signal (dn1) or the delay signal (up1) to the up-down counter UDC2 in a similar manner to the phase detection circuit PD3.

Additionally, in the phase detection circuit PD4, the input data thereof is the clock CK0 that is expected to alter constantly, whereby a circuit may be employed that: compares the result of two alteration points sampled with the clock CK2 with the result at the determination point sampled with the sampling clock CK1, which is between them; determines that the alteration point of the clock CK0 is slow to output the delay signal (up1) when the sampling result at the alteration point, which is obtained just before, is different from the result at the determination point; and determines that the alteration point of the clock CK0 is quick to output the advance signal (dn1) when the sampling result at the alteration point, which is obtained just after, is different from the result at the determination point.

The up-down counter UDC2 inputs the output of the phase detection circuit PD4, in a similar way to the up-down counter UDC 1, and outputs the advance signal (wdn) or the delay signal (wup) at the moment that the number of each became much than that of the other by a certain number. This advance signal (wdn) or delay signal (wup) is sent to the delay control circuit DC2 and the delay control circuit DC3.

Also, in the phase comparison between the phase detection circuit PD3 and the phase detection circuit PD4, the build-up and the lagging edge may be compared twice during one clock cycle. In such a case that 0 or 1 comes one time after 1 or 0 continued, the leading edge is inclined to slow, the back edge to quicken when the pulse width of the clock for transmission having a n/2 multiple frequency input into the first transmitter circuit 200 deviated from 50% of the cycle, one-time-a-one-cycle comparison causes deviation to occur, resulting in that regulation is made in a status one-sided from the center of the data; however, by comparing twice, the merit occurs: an averaging is made, each of the advance and the delay cancels the other, and sampling can be made at the near center.

Next, referring to FIG. 5 and FIG. 6, a specific example of the sampler and 1:2 de-multiplexer 630 will be explained.

The specific example of the sampler and 1:2 de-multiplexer 630 is configured of: a flip-flop F51 that samples the serial data signal with the leading edge of the sampling clock CK1 at the center of the data; a flip-flop F52 that samples the serial data signal with the back edge of the sampling clock CK1; and a flip-flop F53 that further samples the output of the flip-flop F51 with the back edge of the sampling clock CK1.

The sampler and 1:2 de-multiplexer 630 samples two kinds of data with the leading edge and the back edge of the sampling clock CK1 at the center of the data, and simultaneously can obtain two parallel data signals having a n/2 times frequency of the system clock CLKSYS sampled by unifying the timing of the output with the back edge of the sampling clock CK1 by an added flip-flop F53.

Next, referring to FIG. 6, a specific example of the 1:n de-multiplexer 640 will be explained.

Figure 6:
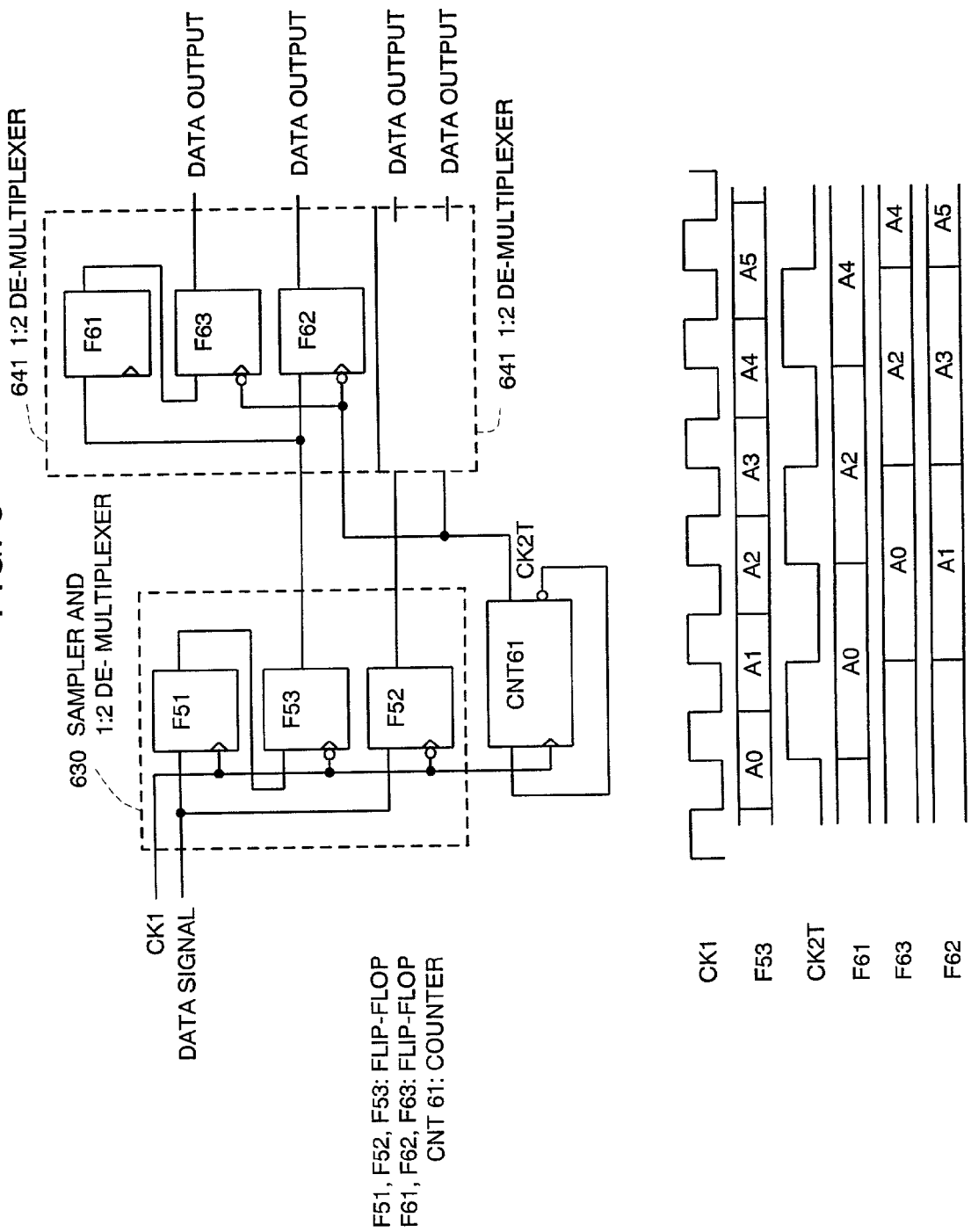
FIG. 6 is a diagram illustrating a specific example and a time chart of a 1:2 de-multiplexer that is one component of a 1:n de-multiplexer in a first and a second date processing circuits in FIG. 1 and FIG. 2.

The 1:2 de-multiplexer 641 shown in FIG. 6 is one component of the 1:n de-multiplexer 640, and the 1:n de-multiplexer 640 is configured to continuously connect the 1:2 de-multiplexers 641 to the output of each former-step one until the 1:n/4 de-multiplexer is configured.

The counter CNT61 divides with the leading edge that is different from the back edge of the unified sampling clock CK1 of the sampler and 1:2 de-multiplexer 630.

The 1:2 de-multiplexers 641 is configured of: flip-flops F61 and F62 that sample the output of the sampler and 1:2 de-multiplexer 630 using the leading edge and the back edge of the clock CK2T that is the output of the counter CNT61; and a flip-flop F63 that samples with the back edge of the clock CK2T the output of the flip-flop F61 sampled with the leading edge of the clock CK2T.

By adding the flip-flop F63, the 1:2 de-multiplexers 641 can obtain two parallel data signals sampled by unifying the timing of the output with the back edge of the clock CK2T. Also, the delay from the unified back edge of the sampling clock CK1 of the former-step sampler and 1:2 de-multiplexer 630 to the output, and the delay from the leading edge to the output of the counter CNT61 become nearly equal, whereby, by reducing the pulse width of the sampling clock CK1 to 50%, the merit occurs: With the leading edge and the back edge of the clock CK2T that is the output of the counter CNT61 the sampling is made at the center of the alteration point of the output of the sampler and 1:2 de-multiplexer 630.

Also, to the other side's output of the sampler and 1:2 de-multiplexer 630 is also connected the 1:2 de-multiplexers 641. But, at the time of n=4, the 1:n/4 de-multiplexer becomes 1:1, the 1:2 de-multiplexers 641 is omitted, and the output of the sampler and 1:2 de-multiplexer 630 is used.

Next, each output of the 1:n/4 de-multiplexer is connected to a 1:4 de-multiplexer 642 such as shown in FIG. 7, and the 1:n de-multiplexer 640 is configured. If the sampler and 1:2 de-multiplexer 630 is included, a 1:2n de-multiplexer is configured.

The counter CNT71 prepares the clock CK3T divided half using the leading edge that is different from the back edge of the sampling clock CK2T of the former-step register.

The counter CNT72 prepares the clock CK4T divided half using the back edge of the clock CK3T.

The 1:4 de-multiplexer 642 is configured of: a flip-flop F71 that samples the input data signal with the leading edge of the clock CK3T for a former-half period of the clock CK4T to hold for a latter-half period of the clock CK4T; a flip-flop F72 that samples the input data signal with the back edge of the clock CK3T for a former-half period of the clock CK4T to hold for a latter-half period of the clock CK4T; a flip-flop F74 that samples the input data signal with the leading edge of the clock CK3T for a latter-half period of the clock CK4T to hold for a former-half period of the clock CK4T; a flip-flop F75 that samples the input data signal with the back edge of the clock CK3T for a latter-half period of the clock CK4T to hold for a former-half period of the clock CK4T; a flip-flop F73 that samples the output of the flip-flop F71 with the back edge of the clock CK3T; and a flip-flop F76 that samples the output of the flip-flop F74 with the back edge of the clock CK3T.

The 1:4 de-multiplexer 642 is connected to the other output of the 1:2 de-multiplexer 641 and the output of the other 1:2 de-multiplexer 641, whereby: the input data signal is unified with the timing of the back edge of the clock CK3T that becomes the clock having the same frequency as that of the system clock CLKSYS; the data is fetched into every former-half period and every latter-half period of the clock CK4T that is two-time period (½ frequency) of the system clock CLKSYS; when sampling is made for a former-half period, the data, which is continued by the data fetched for a latter-half period of its previous period, can be obtained; when the data is fetched for a latter-half period, the data, which is continued by the data fetched for a former-half period of its period, is obtained; and 2n-bit portion's continuous data signals can be obtained.

Additionally, in FIG. 7, in the 1:4 de-multiplexer 642, the former-step thereof was set at the 1:2 de-multiplexer 641; however the sampler and 1:2 de-multiplexer 630 also is acceptable.

Next, referring to FIG. 8, a specific example of the first start-aligned detection circuit 650 will be explained.

The specific example of the first start-aligned detection circuit 650, which is one example in the event of n=4, is configured of a first start-aligned conveyer circuit 651, a start-aligned control circuit 652 and a lead bit position storage circuit 653. Herein, in order of having been input as the serial data signal, the result sampled for a former-half period of the clock CK4T is to be set at D0, D1, D2, and D3, and the result sampled for a latter-half period of the clock CK4T is set to be at D4, D5, D6, and D7.

The first start-aligned conveyer circuit 651 is configured of: conveyer circuits CP8, CP1, CP2, CP3, CP4, CP5, CP6, and CP7 that compare C0, C1, C2, and C3, which are the first specific signal string, with 4 bits starting with each bit of D0, D1, D2, D3, D4, D5, D6, and D7 that are the data, so as to determine the lead bit position of the data; an OR circuit OR81 that applies an OR to the output of the conveyer circuits CP1, CP2, CP3, and CP4 that compared the bit string starting with the lead bits D1, D2, D3, and D4 of which the last bit of each 4-bit comes to be in the latter period of the clock CK4T; an OR circuit OR82 that applies an OR to the output of the conveyer circuits CP5, CP6, CP7, and CP8 that compared the bit string starting with the lead bits D5, D6, D7, and D0 of which the last bit of each 4-bit comes to be in the latter period of the clock CK4T; and a selector S81 that selects for a former-half of the clock CK4T that is the determination time of the output of the OR circuit OR81, and selects for a latter-half of the clock CK4T that is the determination time of the output of the OR circuit OR82.

As with the bit string of which the last bit of the 4 bits starting with each lead bit was sampled for a latter-half of the clock CK4T, the determination time ranges from the back edge of the clock CK3T in a latter-half of the clock CK4T just before the back edge of the clock CK3T in a former-half of the clock CK4T, as with the bit string of which the last bit of the 4-bit was sampled for a former-half of the clock CK4T, the determination time comes to range from the back edge of the clock CK3T in a former-half of the clock CK4T just before the back edge of the clock CK3T in a latter-half of the clock CK4T, whereby, in such above-mentioned configuration, at the determination time that each 4 bits become the continuous 4 bits, it can be determined by checking the output of the selector S81 whether or not the first specific signal string existed.

The start-aligned control circuit 652 is configured of: flip-flops F81 and F82 for synchronizing the regulation start signal from the second data processing circuit 700 with the clock CK3T; and a flip-flop F83 that applies an AND to the negative output of the flip-flops F82 and the output of the flip-flops F83, and inputs the signal obtained by applying an OR to its output and the output of the selector S81 of the first start-aligned conveyer circuit 651.

In such a start-aligned control circuit 652, the regulation start signal, which is of a differential waveform, comes, and is synchronized by the flip-flops F81 and F82, the negative output of the flip-flop F82 becomes 1, 0, 1; however, when the flip-flop F83 is caused to become 0 at the moment of 0, the output of the flip-flop F83 causes the AND output to become 0, even though the negative output of the flip-flop F82 returns to 1, the AND output maintains 0, waits that the output of the selector S81, which becomes the other side's start-aligned detection signal of the OR circuit, becomes 1, and, when the selector S81 becomes 1, causes the flip-flop F83 to become 1. When the flip-flop F83 becomes 1, at this moment, the negative output of the flip-flop F82 returned to 1, whereby the output of the AND circuit becomes 1, the output of the OR circuit also becomes 1, the flip-flop F83 latches 1 as it stands whatever the output of the first start-aligned conveyer circuit 651, which is the other side's input of the OR circuit, might be, and keeps its status as it stands until the regulation start signal comes next. Herein, the indication of the regulation control signal strt that is the output of the flip-flop F83, can be replaced with the indication that the regulation is underway at the time of the reset (0) and the regulation is over at the time of the set (1).

The lead bit position storage circuit 653 is configured of: flip-flops with hold R1, R2, R3 and R4 that, so as to store the lead bit position, set the output of the conveyer circuits CP1, CP2, CP3, and CP4 at the data input, fetches the data for a former-half period of the clock CK4T and yet at the moment that the regulation control signal strt is under regulation, and hold in other conditions; and flip-flops with hold R5, R6, R7 and R8 that set the output of the conveyer circuits CP5, CP6, CP7, and CP8 at the data input, fetch the data for a latter-half period of the clock CK4T and yet at the moment that the regulation control signal strt is under regulation, and hold in other conditions.

Figure 8:
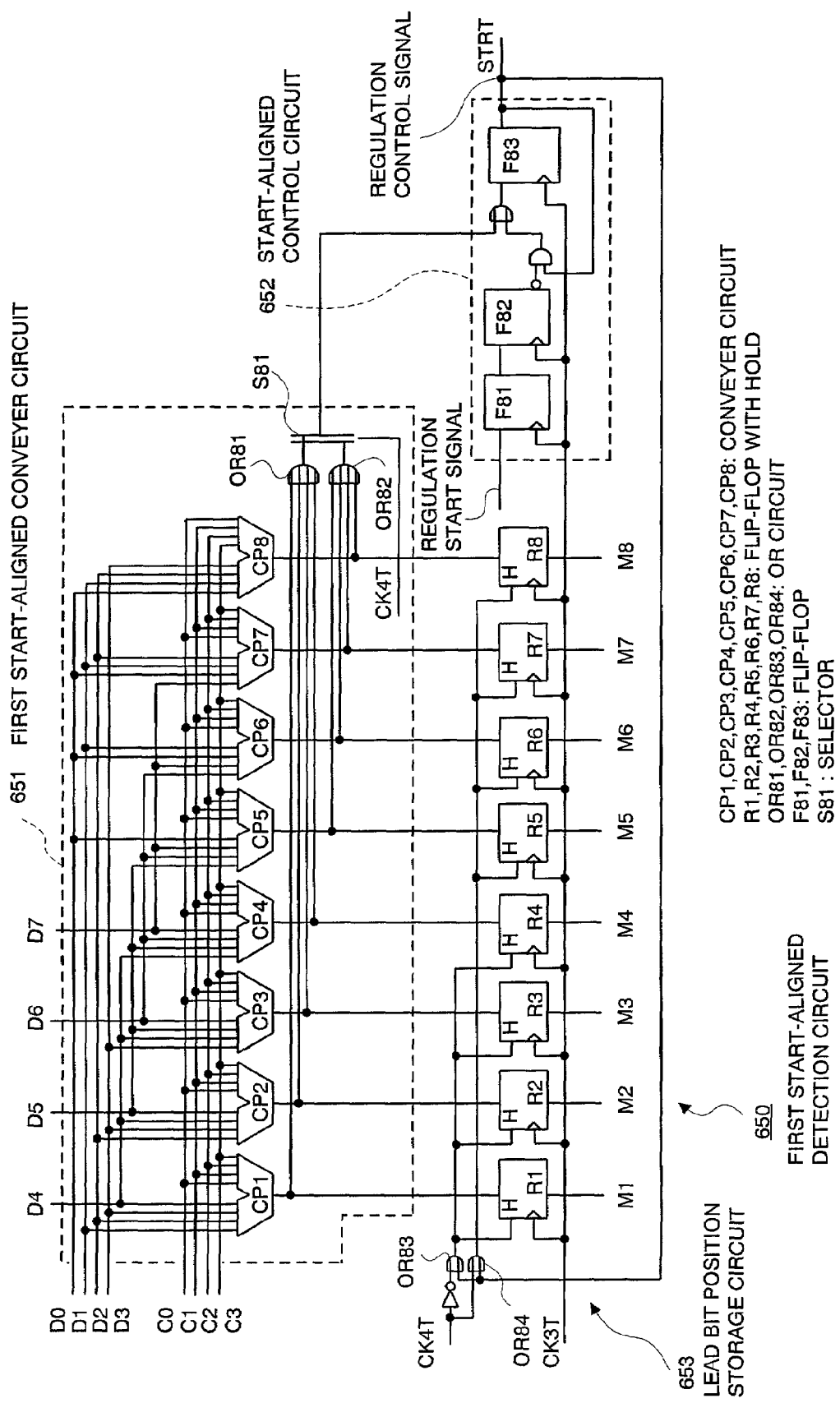
FIG. 8 is a diagram illustrating a specific example of a first start-aligned detection circuit in a first and a second date processing circuits in FIG. 1 and FIG. 2.

So as to fetch the data for a former-half period of the clock CK4T and yet at the moment that the regulation control signal strt is under regulation, and to hold in other conditions, as shown in FIG. 8, the signal obtained by applying an OR to the negative signal of the clock CK4T and the regulation control signal strt, may be input into the hold terminals of the flip-flops with hold R1, R2, R3 and R4 that sample at the time of 0, and hold at the time of 1. Also, So as to fetch the data for a latter-half period of the clock CK4T and yet at the moment that the regulation control signal strt that is the regulation control signal from the start-aligned detection circuit 650 is under regulation, and to hold in other conditions, the signal obtained by applying an OR to the output of the clock CK4T and the regulation control signal strt that is the regulation control signal strt from the first start-aligned detection circuit 650, may be input into the hold terminals of the flip-flops with hold R5, R6, R7 and R8.

Thus, the first start-aligned detection circuit 650 constantly compares the input data signal with the first specific signal string, holds when the regulation start signal does not come, comes to be under regulation when the regulation start signal comes, instructs the regulation finish if the first specific signal string comes to the data signal during regulation, and can store its lead bit position.

Additionally, in the specific example of the first start-aligned detection circuit 650 in FIG. 8, n=4 was set; however n may be set as another value, in this case, the number of the conveyer circuit becomes 2n, CP1, . . . , CP2$n$, the OR circuits OR81 and OR82 have n input respectively, the output of the conveyer circuits up to CP1, . . . , CP$n$ is connected to the input of the OR circuit OR81, the output of the conveyer circuits, CP$n$+1, . . . , CP2$n$ is connected to the input of the OR circuit OR82, the number of the flip-flops with hold R1, . . . , R8 becomes 2n of R1, . . . , R2$n$, the output of the conveyer circuit CP1, . . . , CP$n$ is connected to the input of the respective flip-flops with hold R1, . . . , R$n$, and the output of the conveyer circuit, CP$n$+1, . . . , CP2$n$ is connected to the input of the respective flip-flops with hold R$n$+1, . . . , R$n$. As mentioned early, the data determination time is determined in the 1:n de-multiplexer 640 by whether the last bit was sampled in a former-half period of the clock CK4T or the last bit was sampled in a latter-half period of the clock CK4T, the lead bit of the data of which the last bit was sampled in a latter-half period of the clock CK4T is D1, . . . , D$n$, the lead bit of the data of which the last bit was sampled in a former-half period of the clock CK4T is D$n$+1, . . . , D2$n$−1 and D0, and C0, . . . C3 become C0, . . . , C$n$−1. As with the selector S81 and the start-aligned control circuit 652, no difference exists between the case that n is 4 and the case that n is not 4.

Next, referring to FIG. 9, a specific example of the alignment circuit 650 will be explained.

The specific example of the alignment circuit 650 is configured of: an OR circuit group that applies an OR to the output M1 and M5, M2 and M6, M3 and M7, and M4 and M8 of the lead bit position storage circuit 653 respectively, which are the result of storing the lead bit position in the first start-aligned detection circuit 650; selectors S91, S92, S93, and S94 that select 4 bits starting with two lead bits, which the output of the OR circuit group indicates, from the output of the 1:n de-multiplexer 640, further select for a former-half period of the clock CK4T when the lead bit is D1, . . . , D4, and select for a latter-half period of the clock CK4T when the lead bit is D5, . . . , D7, and D0; and flip-flops F91, F92, F93 and F94 that sample 4 bits of the output of the selectors S91, S92, S93, and S94 with the back edge of the clock CK3T.

The selectors S91, S92, S93, and S94 invalidate the data when the regulation control signal strt from the first start-aligned detection circuit 650 indicates that the regulation is underway, and, fetches n bits starting with the bit next to the first specific signal string, which the lead bit position stored in the first start-aligned detection circuit 650 indicates, as the data signal every n bits when it indicates that regulation is over.

Furthermore, the control is taken so as to make the selectors S91, S92, S93, and S94 valid when the regulation control signal strt from the first start-aligned detection circuit 650 is over, and to make them invalid when it is under regulation, whereby no change occurs when the data is made to be valid; however one cycle portion of the clock CK3T can be quickened when it is made to be invalid.

In such a alignment circuit 650, when the first start-aligned detection circuit 650 detected the first specific signal string to store the lead bit position, any kind of its output is not selected yet, whereby the output of the selectors S91, S92, S93, and S94 do not select any bit and all 0 (or invalid data) is stored in the flip-flops F91, F92, F93 and F94.

From the cycle next to the cycle in which the first specific signal string was detected, the lead bit position was stored, and the regulation control signal strt was issued, the 4 bits next to the lead bit of the different half period from the half period of the clock CK4T in which the first specific signal string was detected are alternately and sequentially selected every 4 bits and are fetched into the flip-flop F91, F92, F93 and F94.

Figure 9:
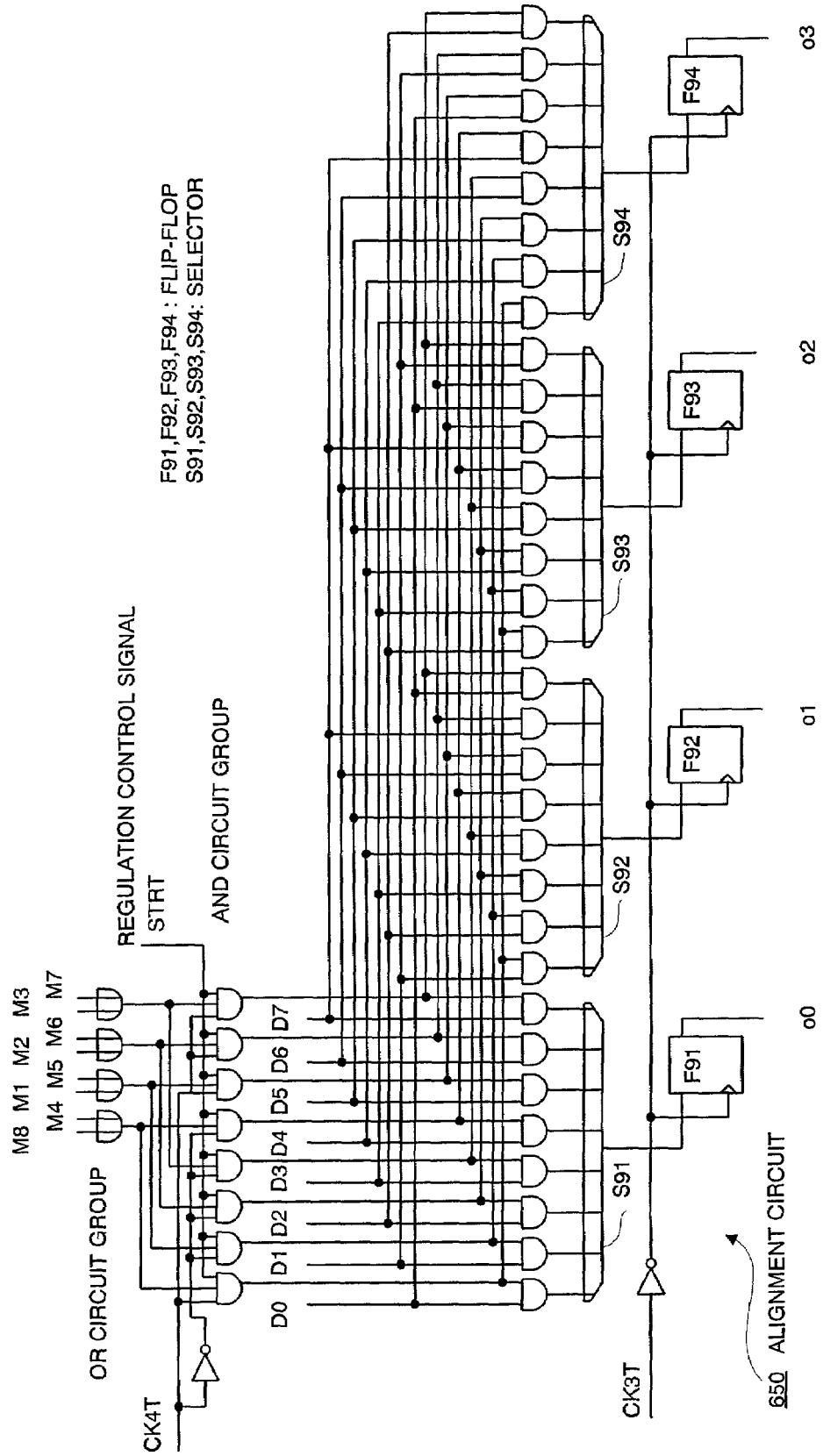
FIG. 9 is a diagram illustrating a specific example of an alignment circuit in a first date processing circuit in FIG. 1 and FIG. 2.

Additionally, in the specific example of the alignment circuit 650 in FIG. 9, n=4 was set; however M1, . . . , M8 may be set at M1, . . . , M2$n$, the input of the OR circuit group may be set at M1 and M$n$+1, M2 and M$n$+2, . . . , M$n$−1 and M2$n$, the selectors S91, S92, S93, and S94 may be set at n-bit portion from the selector S91, the lead bit that its selector selects for a former-half period may be set at D1, . . . , D$n$, and the flip-flops F91, F92, F93 and F94 may be set at n-bit portion from the flip-flop F91.

As described in explaining the first start-aligned detection circuit 650, as to the determination time of 2n bits of the output of the 1:n de-multiplexer 640, the determination time of the bit string in which the last bit of n bits was sampled for a latter-half period of the clock CK4T ranges from the back edge of the clock CK3T of a latter-half period of the clock CK4T just before the back edge of the clock CK3T of a former-half period of the clock CK4T, the determination time of the bit string in which the last bit of n bits was sampled for a former-half period of the clock CK4T ranges from the back edge of the clock CK3T of a former-half period of the clock CK4T just before the back edge of the clock CK3T of a former-half period of the clock CK4T, whereby the bit strings are divided into the group in which the last bits of respective n bits are the lead bits D1, D2, . . . , D$n$ that comes to be in a latter-half period of the clock CK4T and the group in which the last bits of respective n bits are the lead bits D$n$+1, D$n$+2, . . . , D2$n$−1, and D0 that comes to be in a former-half period of the clock CK4T, But, as to the lead bit, the lead bit of the next n bits of the bit string from which the first n bits was taken is D$n$ when the lead bit is D0, the next lead bit becomes D$n$+1 when it is D1, whereby D0 and D$n$, D1 and D$n$+1, D2 and D$n$+2, . . . , D$n$−2 and D2$n$−1 are alternately selected as the same lead bit at respective determination times.

Next, referring to FIG. 10, a specific example of the m-address n-bit FIFO circuit 660 will be explained.

The specific example of the m-address n-bit FIFO circuit 660, which is one example in the event of m=4 and n=4, is configured of: a write address generation circuit 661 that sets the regulation control signal strt from the first start-aligned detection circuit 650 at the start signal, stops the write address when the regulation control signal strt indicates that the DLL circuit 620 is under regulation, generates the write address in circulation of the address 0 to address 3 from the next cycle when it indicates that the regulation is over; and a m×n FIFO 662 with the address number 4 and the bit number 4 that sets at the data input the output o0, o1, o2, and o3 of the flip-flops F91, F92, F93, and F94 of the alignment circuit 650 starting with n bits next to the first specific signal string according to the write address of the write address generation circuit 661, and writes them in circulation of the address 0 to the address 3.

The write address generation circuit 661 is a circuit in which 4 flip-flops FW0, FW1, FW2 and FW3 that output the write addresses 0 to 3 were continuously connected; and the output obtained by applying an AND to the signal obtained by applying an AND to the negative output of the first three flip-flops FW0, FW1, and FW2, and the regulation control signal strt from the first start-aligned detection circuit 650, was input into the first flip-flop FW0.

In the write address generation circuit 661, when the regulation control signal strt from the first start-aligned detection circuit 650 becomes 0 (zero), the AND output becomes 0 (zero) in any status of the output of the flip-flop, 0(zero) is sequentially buried into the 4 flip-flops FW0, FW1, FW2 and FW3, whereby the write address stops, both of two kinds of the AND output become 1 in the event that the regulation control signal strt becomes 1 when all of the first three flip-flops FW0, FW1, and FW2 became 0 (zero), thereby to cause the first flip-flop FW0 to become 1 when the clock CK3T is input, in the next cycle, two kinds of the AND output become 0 (zero), thereby to return the first flip-flop FW0 to 0 (zero), to simultaneously cause the second flip-flop FW1 to become 1, in the next cycle, the first and second flip-flops FW0 and FW1 become 0 (zero), the third flip-flop FW2 becomes 1, further in the next cycle, the third flip-flop FW2 becomes 0 (zero), to simultaneously cause two kinds of the AND output to become 1, to set the fourth flip-flop FW3 at 1 and the status returns to the first one. During the time that the regulation control signal strt became 1, only one of four flip-flops FW0, FW1, FW2 and FW3 becomes 1, and the write address by which 1 is shifted can be generated sequentially in circulation of the address 0 to the address 3. Also, the input of the flip-flops FW1, FW2 and FW3, which are in the second and more steps, is gated with the regulation control signal strt, whereby all addresses can be stopped immediately when the regulation control signal strt is reset.

The m×n FIFO 662, which includes address number portion's flip-flops with bit number portion's holds that fetches the data when the write address is set at 1, and holds when the write address is set at 0, is of a configuration of connecting the hold to the write address output of the write address generation circuit 661, wherein bit number portion's data is adapted to be written into the flip-flop group designated by each of write addresses WA0, WA1, WA2, and WA3.

Next, referring to FIG. 10, a specific example of the mway n-bit multiplexer 670 will be explained.

The specific example of the m-way n-bit multiplexer 670, which is one example in the event of m=4 and n=4, is configured of: an AND circuit group; and an OR circuit group that selects and fetches the written 4-bit data of the 4×4 FIFO 662 according to the read address.

The 4-way 4-bit multiplexer 670, which is the bit number portion's selectors, sets at the input the data output of the 4×4 FIFO 662, which is in the same bit position of each address, selects the address in circulation of the address 0 to the address 3, and selects and outputs the n-bit data of the 4-address 4-bit FIFO circuit 660 written with the write address that accorded to the read address.

Next, referring to FIG. 10, a specific example of the n-bit register 680 will be explained.

The specific example of the n-bit register 680, which is one example in the event of n=4, is configured of 4 flip-flops FD0 to FD3 that write the output of the 4-way 4-bit multiplexer 670 with the system clock CLKSYS.

The 4-bit register 680, which has the 4-bit portion, samples the output of the 4-way 4-bit multiplexer 670 with the system clock CLKSYS to output it as the output of the first data processing circuit 600.

Figure 10:
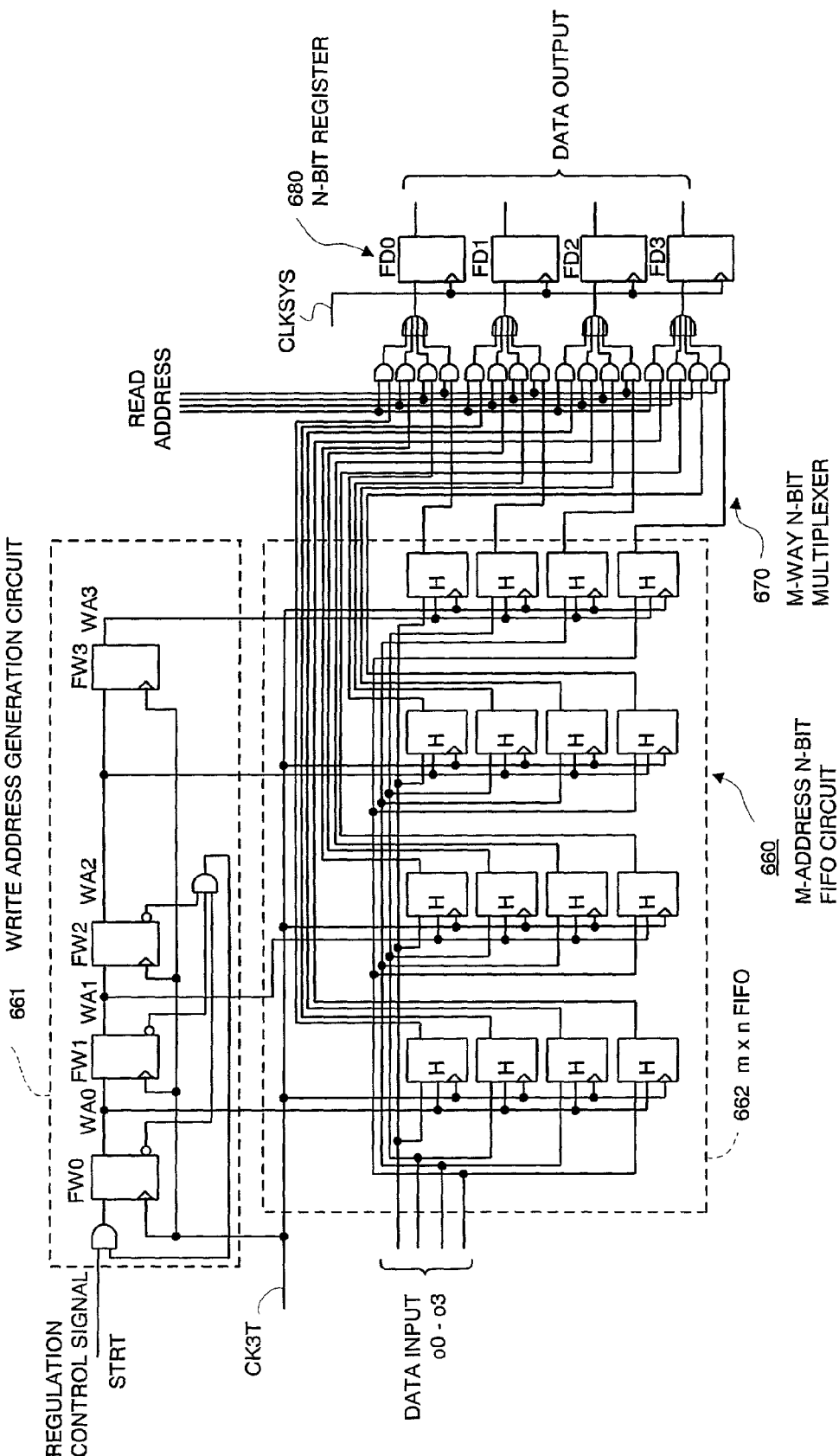
FIG. 10 is a diagram illustrating a specific example of a m-address n-bit FIFO circuit in a first date processing circuit in FIG. 1 and FIG. 2.

Additionally, in the specific example in FIG. 10, m=4 and n=4 was set; although the flip-flop number of the write address generation circuit 661 shall be m, the output of the first flip-flop FW0 to the m-th flip-flop shall be the address 0, the address 1, . . . , the address (m−1) respectively, and an AND is applied to the negative output of the first three flip-flops, instead it is possible that it is replaced with to apply an AND to the negative output of the first (m−1) flip-flops, the flip-flop number of the m×n FIFO 662 shall be m×n that is obtained by multiplying the address number m by the bit number n respectively, and the 4-way 4-bit multiplexer 670 shall be the m-way n-bit multiplexer 670.

Next, referring to FIG. 11, a specific example of the second start-aligned detection circuit 750 will be explained.

The specific example of the second start-aligned detection circuit 750 is configured of a second start-aligned conveyer circuit 751, a third start-aligned conveyer circuit 752, and a regulation control circuit 753.

The second start-aligned conveyer circuit 751, which has the same circuit configuration as that of the first start-aligned conveyer circuit 651 in FIG. 8, inputs and compares the second specific signal string C4, C5, C6 and C7 instead of the first specific signal string C0, C1, C2 and C3, so as to detect whether the second specific signal string is present in the data signal from the 1:n de-multipexer 740, and outputs 1 to the selector S81 when the second specific signal string C4, C5, C6 and C7 is detected.

The third start-aligned conveyer circuit 752, which has the same circuit configuration as that of the first start-aligned conveyer circuit 651 in FIG. 8, inputs and compares the third specific signal string C8, C9, CA and CB instead of the first specific signal string C0, C1, C2 and C3, so as to detect whether the third specific signal string is present in the data signal from the 1:n de-multipexer 740, and outputs 1 to the selector S81 when the third specific signal string C8, C9, CA and CB is detected, The regulation control circuit 753 includes and is configured of: flip-flops FB2, FB3, and FB4 that prepare the regulation start signal that is distributed to the first data processing circuit 600 when the second specific signal string C4, C5, C6 and C7 is detected in the data signal from the 1:n de-multipexer 740, and regulate the DLL circuit 620 of the first data processing circuit 600 by the time that each first data processing circuit 600 detects the first specific signal string C0, C1, C2 and C3; and a flip-flop FB1 that generates the regulation finish signal when the third specific signal string C8, C9, CA and CB are detected in the data signal from the 1:n de-multipexer 640 after the regulation start signal that is the output of the flip-flop FB4 was output.

The regulation control circuit 753, which includes: an AND circuit that applies an AND to the output from the second start-aligned conveyer circuit 751 and the negative output, which was input into the flip-flops FB2 and FB3 and delayed; and a flip-flop FB4 that obtains the regulation start signal, which is of a differential waveform, with the output of this AND circuit set at the input, and distributes the regulation start signal to all first data processing circuit 600.

Also, the regulation control circuit 753, which sets at the input the signal obtained by applying an OR to the output from the third start-aligned conveyer circuit 752, and the signal obtained by applying an OR to the output of the flip-flop FB1 and the negative signal of the clock CK3T, includes a flip-flop FB1 that outputs the regulation finish signal. Additionally, the third specific signal string C8, C9, CA and CB may be caused to become equal to the first specific signal string C0, C1, C2 and C3.

Herein, it is possible that the second specific signal string C4, C5, C6 and C7 shall be all signal strings including 1 and the configuration of the second start-aligned conveyer circuit 751 shall be an 8-input OR circuit that applies an OR to D1, D2, D3, D4, D5, D6, D7, and D0.

Figure 11:
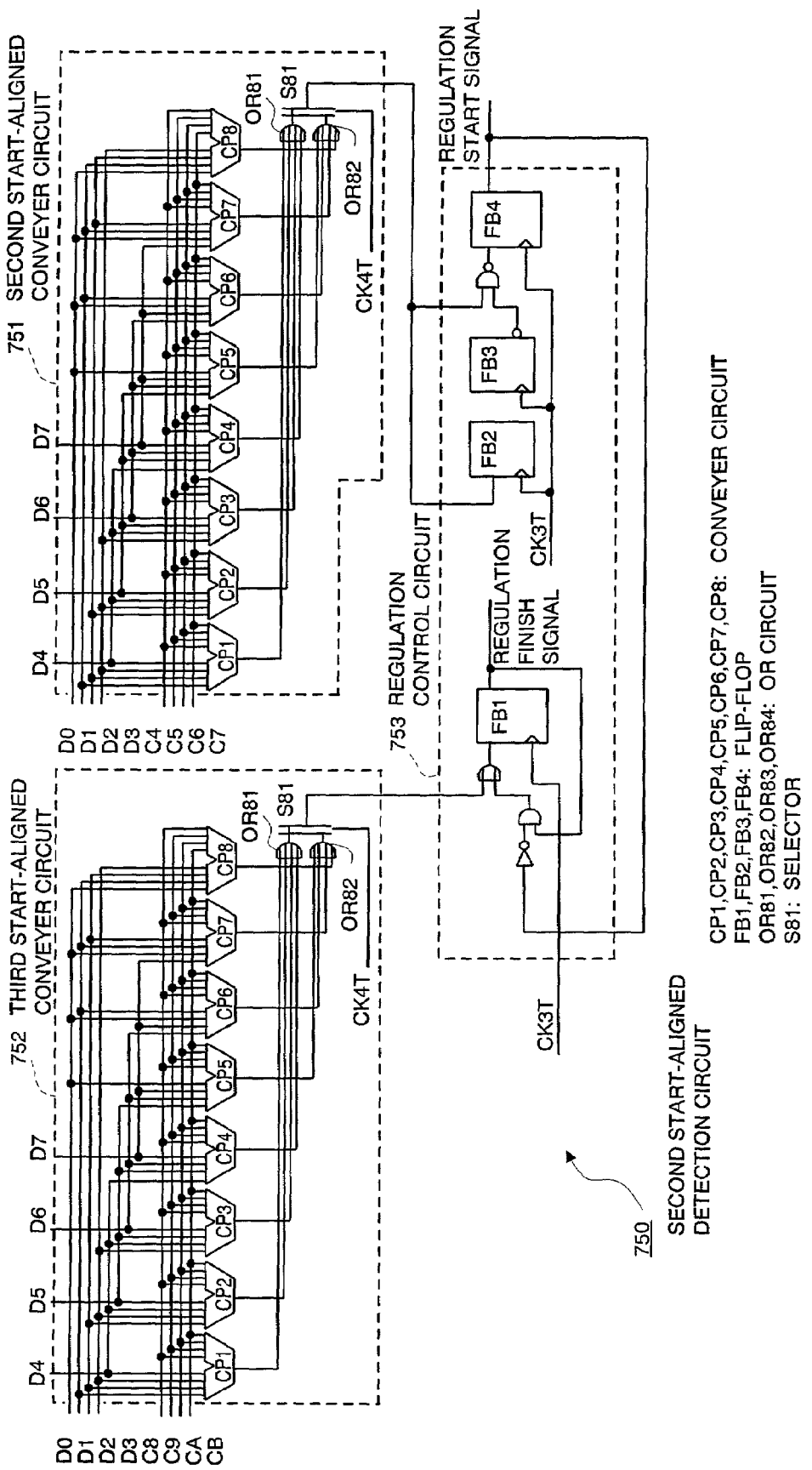
FIG. 11 is a diagram illustrating a specific example of a second start-aligned detection circuit in a second date processing circuits in FIG. 1 and FIG. 2.

Additionally, in the specific example of the second start-aligned detection circuit 750 in FIG. 11, the data was set as 8 bits; however in a similar manner to the first start-aligned detection circuit 650, the data shall be D0, . . . , D2n, the bit number of the second specific signal string and the third specific signal string shall be n bits, the conveyer circuit shall be CP1, . . . , CP2n, the input number of the OR circuit OR81, OR82, OR83, and OR 84 shall be n input, and the 8-input OR circuit, which is an alternative idea of the third start-aligned conveyer circuit 752, shall be a 2n-input OR circuit, whereby it is possible that the second start-aligned detection circuit 750 shall be the second start-aligned detection circuit 750 with a n-bit width.

Next, referring to FIG. 12, a specific example of the synchronizing circuit 760 will be explained.

The specific example of the synchronizing circuit 760 is configured of: flip-flops FC0 and FC1 that synchronize the regulation finish signal, which is the output of the second start-aligned detection circuit 750 with the system clock CLKSYS; and an AND circuit.

The frequency of the regulation finish signal from the second start-aligned detection circuit 750 is caused to be equal to that of the system clock CLKSYS by dividing the clock prepared in the DLL circuit 720; however, since both differs in phase, the synchronizing circuit 760 synchronizes the regulation finish signal with the system clock CLKSYS in the flip-flops FC0 and FC1 to output it as the read address start signal.

Next, referring to FIG. 12, a specific example of the read address generation circuit 770 will be explained.

The specific example of the read address generation circuit 770 is configured of 4 flip-flops FC2, FC3, FC4, and FC5 connected continuously that output the read addresses 0 to 3, an AND circuit that applies an AND to the negative output of the first three flip-flops FC2, FC3 and FC4.

In the read address generation circuit 770, the signal obtained by applying an AND to the read address start signal from the synchronizing circuit 760 and the signal obtained by applying an AND to the negative output of the first three flip-flops FC2, FC3 and FC4 out of the four flip-flops FC2, FC3, FC4 and FC5 connected continuously that output the read addresses 0 to 3 is input into the first flip-flop FC2.

The read address generation circuit 770 stops when the read address start signal from the synchronizing circuit 760 is reset, and prepares the read addresses 0, 1, 2, and 3 that sequentially occur in circulation of the address 0 to the address (m−1) and are distributed to the first data processing circuit 600.

In details, in the read address generation circuit 770, when the read address start signal from the synchronizing circuit 760 becomes 0 (zero), the AND output becomes 0 (zero) in any status of the output of the flip-flop, 0 (zero) is sequentially buried into the 4 flip-flops FC2, FC3, FC4 and FC5, whereby the read address stops. The read address start signal from the synchronizing circuit 760 becomes 1 when all of the first 3 flip-flops FC2, FC3, and FC4 became 0 (zero), both of two kinds of the AND output become 1, if the system clock CLKSYS is input, the read address generation circuit 770 sets the first flip-flop FC2 at 1, in the next cycle, two AND output become 0 (zero), thereby to return the first flip-flop FC2 to 0 (zero), to simultaneously cause the second flip-flop FC3 to become 1, in the next cycle, the first and second flip-flops FC2 and FC3 become 0, the third flip-flop become 1, further in the next cycle, the first, second, and third flip-flop FC2, FC3, and FC4 become 0 (zero), to simultaneously cause two kinds of the AND output to become 1, to set the fourth flip-flop FC5 at 1, and the status returns to the first one. During the time that the read address start signal from the synchronizing circuit 760 was kept to be 1, only one of 4 flip-flops FC2, FC3, FC4, and FC5 becomes 1, the write address, by which 1 is shifted, can be sequentially generated in circulation of the address 0 to the address 3.

Also, the input of the flip-flops FC3, FC4 and FC5, which are in the second and more steps, is gated with the read address start signal from the synchronizing circuit 760, whereby all addresses can be stopped immediately when the read address start signal from the synchronizing circuit 760 is reset.

Figure 12:
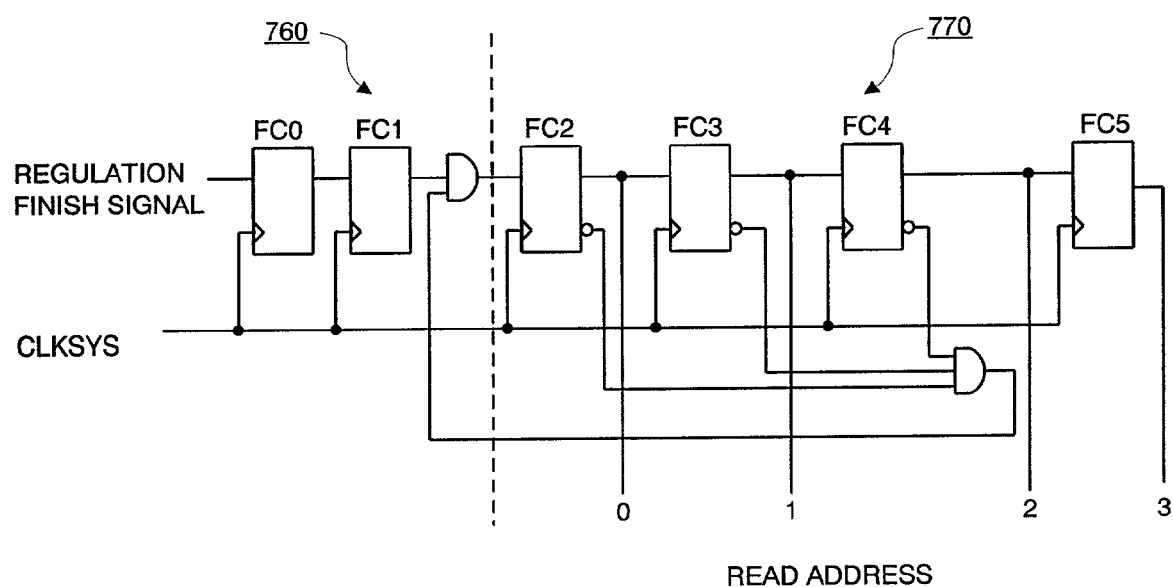
FIG. 12 is a diagram illustrating a specific example of a synchronizing circuit and a read address generation circuit in a second date processing circuits in FIG. 1 and FIG. 2.

Additionally, in the specific example of the read address generation circuit 770 in FIG. 12, the flip-flops were set at 4 flip-flops FC2, FC3, and FC5; although the flip-flop number shall be m, the output of the first flip-flop FC2 to the m-th flip-flop shall be address 0, address 1, . . . , address (m−1) respectively, and an AND is applied to the negative output of the first three flip-flops FC2, FC3, and FC4, instead an AND is applied to the negative output of the first (m−1) flip-flops, whereby application of the address number m becomes possible.

By the way, in the specific example in FIG. 12, 2 flip-flops of the synchronizing circuit 760 are connected continuously, the address number of the m-address n-bit FIFO circuit 660 shall be m; however, the number of the flip-flop of the synchronizing circuit 760 decides the time that the data is read since it was written into the m-address n-bit FIFO circuit 660 of the first data processing circuit 600, whereby, when the time became maximized that: the first specific signal string and the third specific signal string were issued at the same time from the first transmitter circuit 200 and the second transmitter circuit 300; the first specific signal string was detected in the first start-aligned detection circuit 650 via the first transmitter circuit 200, the transmission line 800, the receiver 610 of the first data processing circuit 600, the sampler and 1:2 de-multiplexer 630, and 1:n de-multiplexer 640; and the n bits starting with the next bit were extracted in the alignment circuit 650 and was written into the m-address n-bit FIFO circuit 660, even though the time became minimized that: the third specific signal string was detected as the third specific signal string in the second start-aligned detection circuit 750 via the second transmitter circuit 300, the transmission line 900, the receiver 710 of the second data processing circuit 700, the sampler and 1:2 de-multiplexer 730, and 1:n de-multiplexer 740; the read address is generated via the synchronizing circuit 760 and the read address generation circuit 770; and the signal string was written into the n-bit register 680 via the m-way n-bit multiplexer 670 by its read address, so that the m-address n-bit FIFO circuit 660 writes the data more later than the signal string reaches the n-bit register 680 via the m-way n-bit multiplexer 670, the flip-flop number of the synchronizing circuit 760 is increased, when the time became minimized that: the first specific signal string was detected in the first start-aligned detection circuit 650 via the first transmitter circuit 200, the transmission line 800, the receiver 610 of the first data processing circuit 600, the sampler and 1:2 de-multiplexer 630, and 1:n de-multiplexer 640; and the n bits starting with the bit that was a (m×n+1)th bit from the next bit, which was again written into the address 0 after circulation of the addresses of the m-address n-bit FIFO circuit 660, were extracted in the alignment circuit 650 and were written into the address 0 of the m-address n-bit FIFO circuit 660, even though the time became maximized that: the third specific signal string was detected as the third specific signal string in the second start-aligned detection circuit 750 via the second transmitter circuit 300, the transmission line 900, the receiver 710 of the second data processing circuit 700, the sampler and 1:2 de-multiplexer 730, and 1:n de-multiplexer 740; the read address is generated via the synchronizing circuit 760 and the read address generation circuit 770; and the signal string was written into the n-bit register 680 via the m-way n-bit multiplexer 670 by its read address, so that the m-address n-bit FIFO circuit 660 writes the n-bit data starting with the bit next to the first specific signal string more earlier than the signal string reaches the n-bit register 680 via the m-way n-bit multiplexer 670, the flip-flop number of the synchronizing circuit 760 is reduced. Also, so as to satisfy these two conditions, the address number m of the m-address n-bit FIFO circuit 660 is established.

As explained above, the first analogue PLL circuit 100, the first transmitter circuit 200, the second transmitter circuit 300, the regulation controlling logic circuit 400, the second analogue PLL circuit 500, the first data processing circuit 600 and the second data processing circuit 700 are employed, whereby, for the data signal, which does not possess the redundant bit in the data signal string, for which means of establishing a specific signal string as the start of the data so that a free value is taken can not be employed, and of which alteration into 1 and 0 is not guaranteed, the specific signal string (even though it is 1 bit, it may be acceptable that it would become 1) is sent to the second data processing circuit 700 from the regulation controlling logic circuit 400 via the second transmitter circuit 300 and the transmission line 900, whereby the second data processing circuit 700: recognizes it as the regulation start signal of the DLL circuit 720; initiates the regulation of the sampling clock within the second data processing circuit 700; simultaneously distributes it to the first start-aligned detection circuit 650 of the first data processing circuit 600; invalidates the output of the alignment circuit 650; enables the DLL circuit 620 to be regulated, using the regulation signal string sent to the first data processing circuit 600 via the transmission line 800 from the first transmitter circuit 200; yet makes the regulation for the DLL circuit 620; further, if the first specific signal string is input during the regulation of the DLL circuit 620, in every first data processing circuit 600, causes it to be recognized as the regulation control signal strt that is set at the regulation finish and the data start; and enables to sequentially write n bits starting with the bit next to the first specific signal string in the addresses starting with the address 0 of the m-address n-bit FIFO circuit 660 every n bits.

Also, when the third specific signal string which is output from the regulation controlling logic circuit 400, being synchronized with the first specific signal string, came to the second data processing circuit 700 via the second transmitter 300 and the transmission line 900, the read address start signal of the read address generation circuit 770 is prepared, the read address synchronized with the system clock CLKSYS, which is sequentially generated in circulation of the address 0 to the address m, is prepared, and the data is read out from the m-address n-bit FIFO circuit 660 of each first data processing circuit 600, whereby the parallel data signal sent to the first transmitter circuit 200 from the logic side can be recovered.

(2) Second Embodiment

Figure 2:
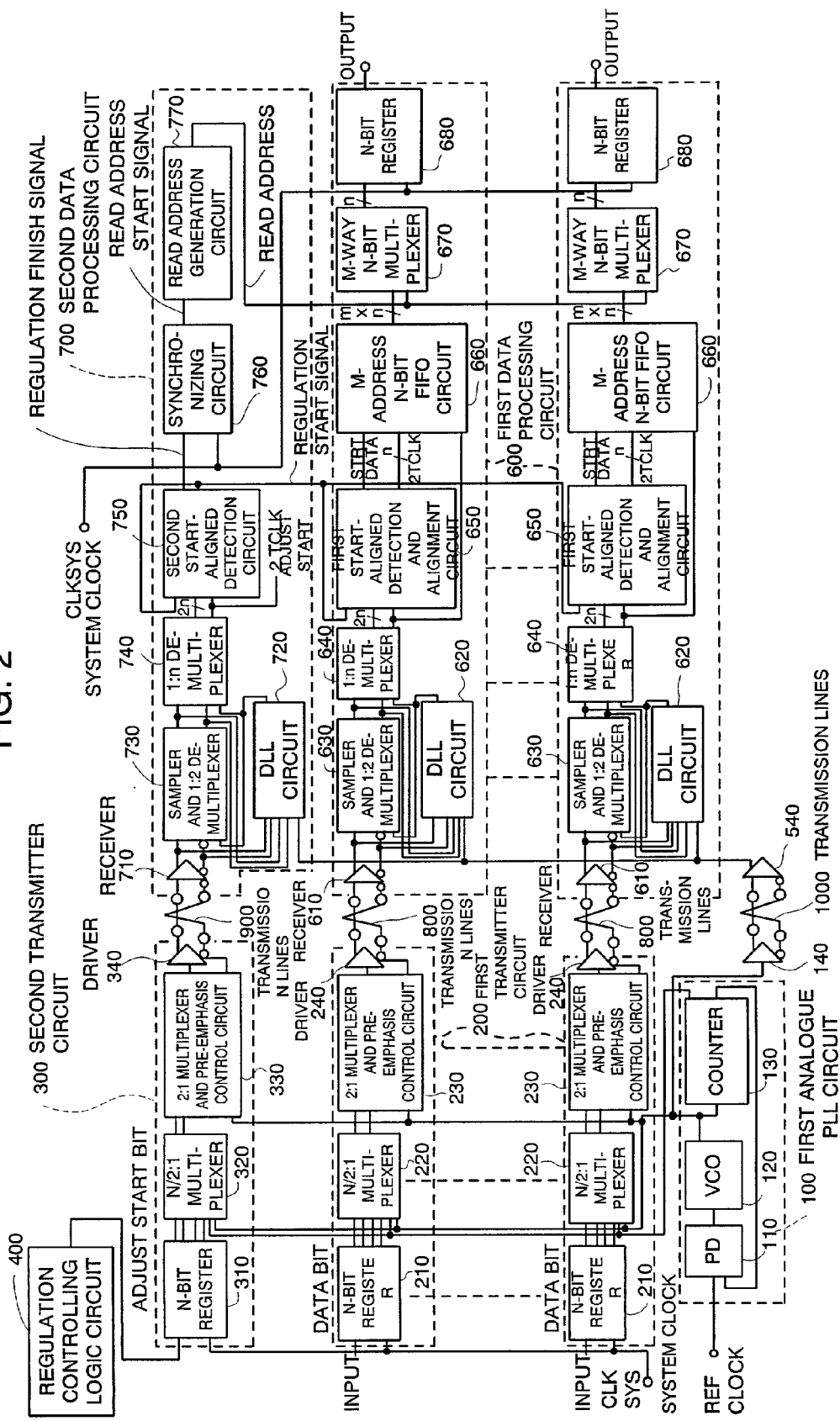
FIG. 2 is a circuit block diagram illustrating a configuration of a high-speed transmission system with a source synchronous technique having a low latency relating to a second embodiment of the present invention.

FIG. 2 is a circuit block diagram illustrating a configuration of a high-speed transmission system with a source synchronous technique having a low latency relating to a second embodiment of the present invention. In the high-speed transmission system having a low latency relating to this embodiment, the basic configuration thereof is nearly similar to that of the high-speed transmission system having a low latency relating to the first embodiment shown in FIG. 1; however the second analogue PLL circuit 500 is omitted, the clock for transmission is adapted to be transmitted from the send side to the receive side. In the first embodiment, to the first data processing circuit 600 and the second data processing circuit 700 was distributed the clock for transmission having a n/2 multiple frequency, which was synchronized with the system clock CLKSYS, from the second analogue PLL circuit 500; however as shown in FIG. 2, a driver 140, a transmission line 1000, and a receiver 540 that transmit the clock for transmission from the first analogue PLL circuit 100 in the send side to the receive side are provided, the second analogue PLL circuit 500 is omitted, instead the clock for transmission having a n/2 multiple frequency, which was synchronized with the system clock CLKSYS received from the send side is adapted to be distributed to the first data processing circuit 600 and the second data processing circuit 700.

By doing so, it becomes possible that not only the second analogue PLL circuit 500 is deleted, but also the clock for transmission having a n/2 multiple frequency, which was synchronized with the system clock CLKSYS, and the clock for transmission in the receive side shall be a clock that has the same frequency and a certain phase relation.

Also, in the event that the system clock CLKSYS in the send side and the system clock CLKSYS in the receive side differ in source, and the REF clock having a completely same frequency can not be distributed to the send side and the receive side, the clock for transmission of the send side and the receive side and the system clock CLKSYS of the receive side do not use the clock having the same source, whereby the frequency differs even though a difference might be minute, the phase deviates with time; however, in such a configuration, to the first transmitter circuit 200 and the second transmitter circuit 300 in the send side and to the first data processing circuit 600 and the second data processing circuit 700 in the receive side can be distributed the clock for transmission having the completely same frequency, whereby the circuit used in FIG. 1 can be used as it stands, the regulation may be settled for the regulation position of the DLLs 620 and 720 to a degree of the temperature fluctuation and the voltage fluctuation, by expecting that the phase would deviate due to a frequency difference between the system clocks CLKSYS, the regulation of the DLL circuits 620 and 720 is to be made within a certain period, the timing setting is carried out for the synchronizing circuit 760 in its certain period with room left for variation of time difference between the write address and the read address, whereby, so that reading before writing, or writing the next data before reading do not occur, as mentioned earlier, the step number of the flip-flop used for synchronization is increased, the address number of m-address n-bit FIFO circuit 660 is increased, and the read start time is altered, whereby it becomes impossible that reading is made before writing into m-address n-bit FIFO circuit 660 is made, or that the next data is written before reading is made.

Additionally, the present invention is not limited to each of the above-mentioned embodiments, variations within the scope and spirit of the present invention will be apparent to those skilled in the art and each embodiment is to be altered appropriately.

As explained above, in accordance with the present invention, for the data signal, which does not possess the redundant bit in the data signal string, for which means of establishing a specific signal string as the start of the data so that a free value is taken can not be employed, and of which alteration into 1 and 0 is not guaranteed, so that the start is simultaneous with the finish at a certain or free period, the second specific signal string, the regulation signal string and the third specific signal string are output from the second transmitter circuit, and the invalid data, the regulation signal string and the first signal string are output from the first transmitter circuit, and continually the data signal is output from the first transmitter circuit, whereby, it becomes possible to carry out a series of processes that the second data processing circuit prepares the regulation start signal of the DDL circuit if the second specific signal string comes, causes the DLL circuit to make the regulation of the sampling lock for the second data processing circuit itself, stops the generation of the read address of the m-address n-bit FIFO circuit, causes the first data processing circuit to distribute the regulation start signal, causes the stored lead bit to be reset, causes the m-address n-bit FIFO circuit to stop the generation of the write address, and causes the output of the alignment circuit to be invalidated, causes the regulation for the DLL circuit to be made by the regulation signal string that came from the first transmitter circuit, further, in every first data processing circuit, if the first specific signal string from the first transmitter circuit is input into the data signal, causes it to be recognized as the regulation finish and the data start, and sequentially write it into the addresses of the m-address n-bit FIFO circuit starting with the address 0.

Also, the almost same time that the first specific signal string comes to the first data processing circuit, the third specific signal string comes to the second data processing circuit, whereby the second data processing circuit recognizes it as the regulation finish, prepares the read address start signal, synchronizes it with the system clock, prepares the read address that is sequentially generated in circulation of the address 0 to the address (m−1), and distribute it to the first data processing circuit, whereby, in each m-address n-bit FIFO circuit, it is made possible that the data written randomly due to variation in transmission line and variation in circuit from the same address simultaneously and yet by synchronizing it with the system clock is caused to be read out, and that the recovered parallel data signal string of the send side's data signal string is obtained. Redundant bits are not added, whereby a ratio of the effective data is high, whereby transmission is made for the same quantity with the less circuits and the clock for transmission reduced and no conversion for the data is necessary, whereby the high-speed transmission system having a low latency, which can suppress latency at a low level, can be provided.

Also, instead of the second analogue PLL circuit, from the first analogue PLL circuit in the send side via the driver, the transmission line and the receiver to the first data processing circuit and the second data processing circuit is adapted to be distributed the clock for transmission having a n/2 multiple frequency, which was synchronized with the system clock, and the step number of the flip-flop of the alignment circuit of the second data processing circuit and the address number of m-address n-bit FIFO circuit of the first data processing circuit shall be as mentioned earlier, whereby also in the system in which the system clock in the send side and the system clock in the receive side differ in source, namely a minute frequency difference exists, the regulation for the DLL circuit within a certain period allows transmission to be made at high-speed without losing the data.

What is claimed is:

1. A high-speed transmission system having a low latency, comprising:

a plurality of first transmitter circuits in a send side; and a plurality of first data processing circuits in a receive side, said first transmitter circuits and said first data processing circuits connected one-to-one via a transmission line, wherein, so as to regulate a Delay Locked Loop (DLL) circuit (620) that regulates a timing of a sampling clock of a data signal of said first data processing circuit (600), a second transmitter circuit (300), a transmission line (900), and a second data processing circuit (700) are provided, and wherein, when a second specific signal string has been sent, a regulation start signal is caused to be distributed from said second data processing circuit (700), and wherein said regulation is caused to be made for said DLL circuit (620) by a regulating signal string, and wherein data starting with a bit next to a first specific signal string detected in a data signal for which a serial-parallel conversion was made is written into a FIFO circuit (660), and simultaneously, a read address synchronized with a system clock (CLKSYS) is generated from a third specific signal string that came to said second data processing circuit (700), and whereby recovery is made for data.

2. The high-speed transmission system having a low latency according to claim 1, wherein a clock for transmission having an n/2 multiple frequency, which is synchronized with a system clock (CLKSYS), is distributed from a first analogue Phase Locked Loop (PLL) circuit (100) to said first data processing circuit (600) and said second data processing circuit (700) via a driver (140), a transmission line (1000), and a receiver (540), said clock for transmission being distributed to said first transmitter circuit (200) and said second transmitter circuit (300).

3. A high-speed transmission system having a low latency and comprising a plurality of first transmitter circuits in a send side and a plurality of first data processing circuits in a receive side respectively, said first transmitter circuit and said first data processing circuits connected one-to-one via a transmission line, said high-speed transmission system comprising:

a plurality of first transmitter circuits (200) each comprising:

an n(a multiple of 2)-bit register (210) that receives input data with a system clock (CLKSYS), with which input data is prepared by splitting an input parallel data and receives a clock having a same frequency as that of the system clock (CLKSYS); and parallel-serial conversion circuits (220 and 230) that convert a parallel data signal that is output from said n(a multiple of 2)-bit registers (210) into a serial data signal, using a clock for transmission having an n/2 multiple frequency which is synchronized with the system clock (CLKSYS), or a divided clock of said clock, for transmission, such that, when an invalid data string, a regulation signal string that changes surely into 1 and 0, and a first specific signal string comes out at a free or a certain period from said first transmitter circuit (200), so that start times of the invalid data string and a second specific signal string become same and finish times of the first specific signal string and a third specific signal string become same, a regulation controlling logic circuit (400) generates the second specific signal string, the regulation signal string that changes surely into 1 and 0, and the third specific signal string;

a second transmitter circuit (300) comprising:
an n-bit register (310) that receives an output signal of said regulation controlling logic circuit (400) with the system clock (CLKSYS) or a clock having a same frequency as that of the system clock (CLKSYS); and parallel-serial conversion circuits (320 and 330) that convert a parallel data signal that is an output of said n-bit register (310) into a serial data signals using, for transmission, a clock for transmission having an n/2 multiple frequency, synchronized with the system clock (CLKSYS), or a de-multiplied clock of said clock;

said plurality of first data processing circuits (600) each comprising:
a DLL circuit (620) that makes a phase comparison between an output of the DLL circuit (620) that sets at an input the clock for transmission having an n/2 multiple frequency of the system clock (CLKSYS) synchronized to the clock for transmission used in said first transmitter circuits (200), and a serial data signal from one of said first transmitter circuits (200) to regulate a sampling clock so as to have a timing at a center of data;

sampler and serial-parallel conversion circuits (630 and 640) that sample a serial data signal from the sampling clock to convert it into a parallel data signal;

a first start-aligned detection circuit (650) that resets a regulation control signal (strt) indicating a regulation start and a regulation finish of said DLL circuit (620) when the regulation start signal comes out, releases a hold of a flip-flop that stored a lead bit position, compares the first specific signal string with a parallel data signal that are outputs from said serial parallel conversion circuits (630 and 640) that sets the regulation control signal (strt) in an event that they accorded when the regulation control signal (strt) was reset, and stores and holds a lead bit position;

an alignment circuit (650) that invalidates an output with a regulation control signal (strt) reset by this first start-aligned detection circuit (650), and, according to a storage result of the lead bit position of said first start-aligned detection circuit (650) when the regulation control signal (strt) was set in said first start-aligned detection circuit (650), outputs n bits, starting with a bit next to the signal string, that accorded, as data every n bits;

a write address generation circuit (661) that stops when the regulation control signal (strt) of said first start-aligned detection circuit (650) is a reset, and generates write addresses that circulate, starting with an address 0 until an (m−1)th address, when it is a set;

an m-address n-bit FIFO circuit (660) that sequentially writes an output of said alignment circuit (650) into a designated address according to an output of the write address generation circuit(661);

an m-way n-bit multiplexer (670) that selects a data signal of the address designated by the read address written in said m-address n-bit FIFO circuit (660), being synchronized with the system clock (CLKSYS); and an n-bit register(680) that writes an output of this m-way n-bit multiplexer (670);

a second data processing circuit (700) comprising:
a DLL circuit (720) that makes a phase comparison between an output of the DLL circuit (720) that sets at an input the clock for transmission having an n/2 multiple frequency of the system clock (CLKSYS) synchronized with the clock for transmission used in said second transmitter circuits (300) and a serial data signal from said second transmitter circuits (300), to regulate a sampling clock so as to have a sampling timing at the center of data;

sampler and serial-parallel conversion circuits (730 and 740) that sample a serial data signal with a sampling clock to convert it into a parallel data signal;

a second start-aligned detection circuit (750) that compares an output of said sampler and serial-parallel conversion circuits (730 and 740) with the second specific signal string, prepares a regulation start signal with a given pulse width indicating a regulation of said DLL circuit (720) when they accorded, distributes it to said first data processing circuit (600), resets a regulation finish signal, compares the output of said serial-parallel conversion circuits (730 and 740) with a third specific signal string, and sets a regulation finish signal when they accorded;

a synchronizing circuit (760) that synchronizes the regulation finish signal with the system clock (CLKSYS) and outputs a read address start signal at such timing that the read address start signal is output after the output of said alignment circuit (650) was written into said m-address n-bit FIFO circuit (660) and yet before a next data is written into the same address in said m-address n-bit FIFO circuit (660) of said plurality of said first data processing circuits (600); and a read address generation circuit (770) that stops when the read address start signal from this synchronizing circuit (760) is reset, and distributes the read addresses that is sequentially generated in circulation of an address 0 to an address (m−1), and yet simultaneously designates a same address for a plurality of said m-address n-bit FIFO circuits (660) of said first data processing circuit (600) when a read address start signal from this synchronizing circuit (760) is set.

4. The high-speed transmission system having a low latency according to claim 3, further comprising:
a first analogue PLL circuit (100) that distributes to said first transmitter circuit (200) and said second transmitter circuit (300) the clock for transmission having an n/2 multiple frequency, which is synchronized with said system clock (CLKSYS), and a second analogue PLL circuit (500) that distributes to said first data processing circuit (600) and said second data processing circuit (700) the clock for transmission having an n/2 multiple frequency, which is synchronized with the system clock (CLKSYS).

5. The high-speed transmission system having a low latency according to claim 4, wherein, in said first analogue PLL circuit (100) and in said second analogue PLL circuit (500), the system clock (CLKSYS) in the send side and the system clock (CLKSYS) in the receive side are synchronized clock signals, and the system clock (CLKSYS), or a signal having a given phase relation with the system clock (CLKSYS), or having the same or 1/k (k is an integer) frequency is set at a REF clock, each said first analogue PLL circuit and said second analogue PLL circuit respectively comprising:

a voltage control-type variable frequency oscillator (120 and 520) that oscillates at an n/2 multiple frequency;

a counter (130 and 530) that divides so that a REF clock has a same frequency as that of the system clock when an output of the voltage control-type variable frequency oscillator (120 and 520) is an n/2 multiple frequency of the system clock (CLKSYS); and a phase comparator (110 and 510) that makes a phase comparison between an output of the counter (130 and 530) and the REF clock to control a control voltage of said voltage control-type variable frequency oscillator (120 and 520) so that a phase and a frequency of the output of said counter (130 and 530) become equal to that of the REF clock.

6. The high-speed transmission system having a low latency according to claim 3, further comprising:

a first a first analogue PLL circuit (100) that distributes to said first transmitter circuit (200) and said second transmitter circuit (300) the clock for transmission having an n/2 multiple frequency, which is synchronized with said system clock (CLKSYS), wherein, an output of the first analogue PLL circuit (100) in the send side is distributed to said first data processing circuit (600) and said second data processing circuit (700) via a driver (140), a transmission line (1000) and a receiver(540) as a clock for transmission having an n/2 multiple frequency.

7. The high-speed transmission system having a low latency according to claim 6, wherein the system clock (CLKSYS) in the send side and the system clock (CLKSYS) in the receive side are not synchronized.

8. The high-speed transmission system having a low latency according to claim 3, wherein said first transmitter circuit (200) and said second transmitter (300) comprise:

pre-emphasis control circuits (230 and 330) that increase an output multitude of drivers (240 and 340) when a data signal is different from one that is behind one data portion, and reduce it when it is the same; and drivers (240 and 340) that generate a data signal pre-emphasized according to an output of these pre-emphasis control circuits (230 and 330), of which a pre-emphasis quantity is selectable.

9. The high-speed transmission system having a low latency according to claim 3, wherein each of said parallel-serial conversion circuits (220 and 230; 320 and 330) comprise:

an n/2:1 multiplexer (220; 320) that includes a plurality of 2:1 multiplexer and registers (221) that are comprised of:

a selector (S0) that sets 2 bits of former-step flip-flops (F30 and F31) at input, sets a clock (CK30) of the former-step flip-flops (F30 and F31) at a selection signal, selects an output of the flip-flop (F30) for a first half period of the clock (CK30), and selects an output of the flip-flop (F31) for a remaining half period; and a flip-flop (F32) having a two-multiple frequency of the clock (CK30) that samples an output of said selector (S0) with an edge of a clock (CK31) that differs in a phase from a sampling edge of the clock (CK30), said n/2:1 multiplexer (220; 320) configured to continuously connect said 2:1 multiplexer and registers (221) so as to set the former-step register in a first step at said n-bit register (210) and to set the register of said 2:1 multiplexer and registers (221) at the former-step register in a second step and more; and a 2:1 multiplexer (230; 330) that is comprised of selectors (S40 and S41) that set at a selection signal a sampling clock (CK41) adapted so that a sampling edge of last flip-flops (F40 and F41) of said n/2:1 multiplexer (220; 320) becomes a back edge, selects a positive output and a negative output of the flip-flop (F40) for a former-half period of the sampling clock (CK41), and a positive output and a negative output of the flip-flop (F42) obtained by sampling an output of a flip-flop (F41) with a leading edge of the sampling clock (CK41) set at a sampling edge for a latter-half period of the sampling clock (CK41).

10. The high-speed transmission system having a low latency according to claim 3, wherein said sampler and serial-parallel conversion circuits (630 and 640; 730 and 740) comprise:

a sampler and de-multiplexer (630; 730) comprised of:

a flip-flop (F51) that samples a serial data signal with a leading edge of a sampling clock (CK1) by keeping it at a center of data;

a flip-flop (F52) that samples a serial data signal with a back edge of the sampling clock (CK1) by keeping it at the center of data; and a flip-flop (F53) that samples with the back edge of the sampling clock (CK1) the output of a flip-flop (F51) sampled with the leading edge, said sampler and de-multiplexer (630; 730) outputting two parallel data signals sampled with timing of the output unified with the back edge of the sampling clock (CK1);

a 1:n de-multiplexer (640) that is configured of a 1:4 de-multiplexer, comprising:

a 1:n/4 de-multiplexer in which 1:2 de-multiplexers (641), which obtain two parallel data of which output timing was unified with a back edge of a clock (CK2T), are connected continuously in 0 (zero) to plural steps, said 1:2 de-multiplexer comprising:

a counter (CNT61) that divides with a leading edge of a sampling clock (CK1);

flip-flops (F61 and F62) that sample an output of the flip-flop sampled with a back edge of a former-step sampling clock (CK1), unified using a leading edge and a back edge of a clock (CK2T) that is an output of this counter (CNT61); and a flip-flop (F63) that samples, with the back edge of the clock (CK2T), the output of the flip-flop (F61) sampled with the leading edge of the clock (CK2T);

a counter (CNT71) that prepares a clock (CK3T) divided in half, using a leading edge of a sampling clock of a register (in an event of the zero step, the sampler and 1:2 de-multiplexer (630)) that is each output of these 1:n/4 de-multiplexers;

a counter (CNT72) that prepares a clock (CK4T) divided in half, using a back edge of the clock (CK3T);

a flip-flop (F71) that samples an input data signal with the leading edge of the clock (CK3T) for a former-half period of a clock (CK4T) and holds for a latter-half period of the clock (CK4T);

a flip-flop (F72) that samples with a back edge of the clock (CK3T) for a former-half period of the clock (CK4T) and holds for a latter-half period of the clock (CK4T);

a flip-flop (F74) that samples an input data signal with a leading edge of the clock (CK3T) for a latter-half period of the clock (CK4T) and holds for a former-half period of the clock (CK4T);

a flip-flop (F75) that samples with the back edge of the clock (CK3T) for a latter-half period of the clock (CK4T) and holds for a former-half period of the clock (CK4T);

a flip-flop (F73) that samples the output of the flip-flop (F71) with the back edge of the clock (CK3T); and a flip-flop (F76) that samples the output of the flip-flop (F74) with the back edge of the clock (CK3T).

11. The high-speed transmission system having a low latency according to claim 3, wherein said first start-aligned detection circuit (650) comprises:

a first start-aligned conveyer circuit (651) comprised of:
an OR circuit (OR81) comprising 2n conveyer circuits (CP1, ..., CP2n) that compare n bits (C0, ..., Cn−1), which are a first specific signal string, with n bits starting with each bit of 2n bits (D0, ..., D2n−1) of an output of said 1:n de-multiplexer (640) that is data), and applies an OR to each output of the conveyer circuits (CP1, CP2, ..., CPn) that compared a bit string that starts with lead bits (D1, D2, ..., Dn) that come to be in a latter-half period of a clock (Ck4T) of 1:4 de-multiplexer (642) of said 1:n de-multiplexer (640);

an OR circuit (OR82) that applies an OR to each output of conveyer circuits (CPn+1, ..., CP2+n) that compare a bit string of which the last bit of each n bits starts with lead bits (Dn+1, ..., D2n−1 and D0) that become a bit sampled for a former-half period of the clock (CK4T); and a selector (S81) that selects an output of said OR circuit (OR81) for a former-half period of a clock (CK4T) and selects for a latter-half period of the clock (CK4T) that is a determination period of said OR circuit (OR82);

a start-aligned control circuit (652) comprising:
flip-flops (F81 and F82) for synchronizing a regulation start signal with the clock (CK3T); and a flip-flop (F83) that applies an AND to a negative output of the flip-flop (F82) and an output of the flip-flop (F83), and set at an input a signal obtained by applying an OR to an output of the AND and an output of the selector (S81) of said first start-aligned conveyer circuit (651); and a lead bit position storage circuit (653) comprised of:
n flip-flops with hold (R1, ..., Rn) that set at a data input an output of the conveyer circuits (CP1, ..., CPn), fetch data for a former-half period of the clock (CK4T) and yet at a time that an output of said start-aligned control circuit (652) is under regulation, and holds in the other conditions;

n flip-flops (Rn+1, ..., R2n) that set at a data input an output of the conveyer circuits (CPn+1, ..., CP2n) fetch data for a latter-half period of the clock (CK4T) and yet at the time that the output of said start-aligned control circuit (652) is under regulation, and holds in the other conditions.

12. The high-speed transmission system having a low latency according to claim 3, wherein said alignment circuit (650) comprises:

an OR circuit group that applies an OR to an output of a free lead bit position storage circuit (653) and an output of an nth-bit lead bit position storage circuit (653) from a lead bit position of this lead bit position storage circuit (653);

n selectors (S91, S92, ..., S9n) that select from an output of the 1:n de-multiplexer (640) n bits starting with two lead bits that the output of this OR circuit group indicates, further select for a former-half period of the clock (CK4T) when the lead bits are D1, ..., Dn, and select for a latter-half period of the clock (CK4T) when the lead bits are Dn+1, ..., D2n and D0; and flip-flops (F91, F92, ..., F9n) that sample n bits of an output of these selector (S91, S92, ..., S9n) with a back edge of the clock (CK3T).

13. The high-speed transmission system having a low latency according to claim 3, wherein, from a m-address n-bit FIFO circuit (660) comprising:

a write address generation circuit (661) that inputs a signal obtained by applying an AND to negative outputs of first (m−1) flip-flops out of m flip-flops connected continuously, into a first flip-flop, and applies an INPUT and an AND to a regulation control signal (strt) of said start-aligned control circuit (652) of said first start-aligned detection circuit (650) in inputting the signal into the first flip-flop or all flip-flops; and an m×n FIFO (662) having an address number m and a bit number n that writes an output of said alignment circuit (650) as a data input according to a write address, said m-way n-bit multiplexer (670) fetches n-bit data written in said m×n FIFO (662) according to a read address.

14. The high-speed transmission system having a low latency according to claim 3, wherein said n-bit register (680) comprises n flip-flops (FD0, FD1, FD2, and FD3) that write an output of said m-way n-bit multiplexer (670) with the system clock (CLKSYS).

15. The high-speed transmission system having a low latency according to claim 3, wherein said second data processing circuit (700) comprises:

a second start-aligned conveyer circuit (751) comprising:
an OR circuit (OR81) that includes 2n conveyer circuits (CP1, ..., CP2n) that compare n bits, which are a second specific signal string, with n bits starting with each bit of 2n bits (D0, ..., D2n−1) of an output of said 1:n de-multiplexer (740) that is data, and applies an OR to each output of conveyer circuits (CP1, CP2, ..., CPn) that compared a bit string starting with lead bits (D1, D2, ..., Dn), of which a last bit of respective n bits comes to be in a latter-half period of a clock (Ck4T) of the 1:4 de-multiplexer of said 1:n de-multiplexer (740);

an OR circuit (OR82) that applies an OR to each output of the conveyer circuits (CPn+1, ..., CP2+n) that compared a bit string starting with lead bits (Dn+1, ..., D2n−1 and D0), of which a last bit of each n bits becomes a bit sampled for a former-half period of the clock (CK4T); and a selector (S81) that selects an output of said OR circuit (OR81) for a former-half period of the clock (CK4T)

and selects it for a latter-half period of the clock (CK4T) that is a determination period of said OR circuit (OR82);

a third start-aligned conveyer circuit (752) comprising:

an OR circuit (OR81) that includes 2n conveyer circuits (CP1, . . . , CP2n) that compare n bits (C0, . . . , Cn−1), which are a third specific signal string, with n bits starting with each bit of 2n bits (D0, . . . , D2n−1) of the an output of said 1:n de-multiplexer (740) that is data, and applies an OR to each output of the conveyer circuits (CP1, CP2, . . . , CPn) that compared a bit string starting with lead bits (D1, D2, . . . , Dn), of which a last bit of respective n bits comes to be in a latter-half period of the clock (Ck4T) of the 1:4 de-multiplexer of said 1:n de-multiplexer (740);

an OR circuit (OR82) that applies an OR to each output of conveyer circuits (CPn+1, . . . , CP2+n) that compared a bit string starting with lead bits (Dn+1, . . . , D2n−1 and D0), of which a last bit of respective n bits becomes a bit sampled for a former-half period of the clock (CK4T); and a selector (S81) that selects an output of said OR circuit (OR81) for a former-half period of the clock (CK4T) and selects it for a latter-half period of the clock (CK4T) that is a determination period of said OR circuit (OR82); and a regulation control circuit (753) comprising:

a flip-flop (FB4) that applies an AND to an output of said second start-aligned conveyer circuit (751), and an output of a plurality of flip-flops (FB2 and FB3) connected continuously that obtain a negative output delayed with a same output set at an input, and prepares a regulation start signal that is of a pulse waveform to distribute it to all said first data processing circuits (600); and a flip-flop (FB1) that sets at the input a signal obtained by applying an OR to a signal obtained by applying an AND to the negative signal of the regulation start signal and the output of the flip-flop (FB1), and the output of the selector (S81) of said third start-aligned conveyer circuit (752), and prepares a regulation finish signal.

16. The high-speed transmission system having a low latency according to claim 3, wherein said read address generation circuit (770):

sets at an input of a first flip-flop a signal obtained by applying an AND to negative outputs of first (m−1) flip-flops (FC2 to FC4) out of m flip-flops (FC2 to FC5) connected continuously;

applies an INPUT and an AND to a read address start signal from a synchronizing circuit (760) in inputting a first or all flip-flops; and distributes to all said first data processing circuits (600) a prepared read address from m flip-flops (FC2 to FC5).

17. The high-speed transmission system having a low latency according to claim 3, wherein said parallel-serial conversion circuits (220 and 230; 320 and 330) comprise:

an n/2:1 multiplexer (220; 320) comprising a plurality of 2:1 multiplexer and registers (221) comprising:

a selector(S0) that sets 2 bits of former-step flip-flops (F30 and F31) at an input, sets a clock (CK30) of the former-step flip-flops (F30 and F31) at a selection signal, selects an output of the flip-flop (F30) for a first-half period of the clock (CK30), and selects an output of the flip-flop (F31) for a remaining half period; and a flip-flop (F32) that samples an output of said selector (S0) with an edge of the clock (CK31) having a 2-multiple frequency of the clock (CK30), which differs in a phase from a sampling edge of the clock(CK30), said n/2:1 multiplexer (220; 320) configured to continuously connect said 2:1 multiplexer and registers (221) so as to set a register in a former-step of a first step at said n-bit register (210), and to set the register of said 2:1 multiplexer and register (221) at former-step in the a second step and more;

a 2:1 multiplexer (230; 230) comprising selectors (S40 and S41) that set at the selection signal a sampling clock (CK41) adapted so that a sampling edge of a last flip-flop (F40 and F41) of said n/2:1 multiplexer (220; 320) becomes a back edge, select and output a positive output and a negative output of the flip-flop (F40) for a former-half period of the sampling clock (CK41), and a positive output and a negative output of the flip-flop (F42) obtained by sampling an output of the flip-flop (F41) by setting a leading edge of the sampling clock (CK41) as a sampling edge for a latter-half period of the sampling clock (CK41), and wherein said sampler and serial-parallel conversion circuits (630 and 640; 730 and 740) comprise:

a sampler and 1:2 de-multiplexer (630; 730) comprising:

a flip-flop (F51) that samples a serial data signal with a leading edge of the sampling clock (CK1) by keeping it at a center of data;

a flip-flop (F52) that samples it with a back edge of the sampling clock (CK1); and a flip-flop (F53) that samples with the leading edge of the sampling clock (CK1) an output of the flip-flop (F51) sampled with the leading edge; said sampler and 1:2 de-multiplexer (630; 730) outputting two parallel data signals sampled by unifying the timing of the output with the back edge of the sampling clock (CK1); and a 1:n de-multiplexer (640) comprising a 1:4 de-multiplexer (642) comprising:

a 1:n/4 de-multiplexer in which 1:2 de-multiplexers (641) were continuously connected in 0 (zero) to plural steps, said 1:2 de-multiplexer (641) comprising:

a counter (CNT61) that divides with a leading edge of the sampling clock (CK1);

flip-flops (F61 and F62) that sample the output of the flip-flop sampled by unifying with the back edge of the former-step sampling clock (CK1), using the leading edge and the back edge of the clock (CK2T) that is the output of this counter (CNT61); and a flip-flop (F63) that samples with the back edge of the clock (CK2T) the output of the flip-flop (F61) sampled with the leading edge of the clock (CK2T), said 1:2 de-multiplexer (641) obtaining two parallel data signals of which the timing of the output was unified with the back edge of the clock (CK2T);

a counter (CNT71) that prepares a clock (CK3T) divided in half, using the leading edge of the sampling clock of the register (in the event of zero step, the sampler and 1:2 de-multiplexer (630)) that is each output of this 1:n/4 de-multiplexer;

a counter (CNT72) that prepares a clock (CK4T) divided in half, using the back edge of the clock (CK3T);

a flip-flop (F71) that samples input data signal with a leading edge of the clock (CK3T) for a former-half period of the clock (CK4T) to hold for a latter-half period of the clock (CK4T);

a flip-flop (F72) that samples with a back edge of the clock (CK3T) for a former-half period of the clock (CK4T) to hold for a latter-half period of the clock (CK4T);

a flip-flop (F74) that samples input data signal with the leading edge of the clock (CK3T) for a latter-half period of the clock (CK4T) to hold for a former-half period of the clock (CK4T);

a flip-flop (F75) that samples with the back edge of the clock (CK3T) for a latter-half period of the clock (CK4T) to hold for a former-half period of the clock (CK4T);

a flip-flop (F73) that samples the output of the flip-flop (F71) with the back edge of the clock (CK3T); and a flip-flop (F76) that samples the output of the flip-flop (F74) with the back edge of the clock (CK3T), and where said first start-aligned detection circuit (650) comprises:

a first conveyer circuit (651) comprises:

an OR circuit (OR81) that includes 2n conveyer circuits (CP1, . . . , CP2n) that compare n bits (C0, . . . , Cn−1), which are a first specific signal string, with n bits starting with each bit of 2n bits (D0, . . . , D2n−1) of the output of said 1:n de-multiplexer (640) that is data, and applies an OR to each output of the conveyer circuits (CP1, CP2, . . . , CPn) that compared a bit string starting with lead bits (D1, D2, . . . , Dn), of which a last bit of respective n bits comes to be in a latter-half period of the clock (Ck4T) of 1:4 de-multiplexer (642) of said 1:n de-multiplexer (640);

an OR circuit (OR82) that applies an OR to each output of the conveyer circuits (CPn+1, . . . , CP2+n) that compared a bit string starting with lead bits (Dn+1, . . . , D2n−1 and D0), of which the a last bit of respective n bits becomes a bit sampled for a former-half period of the clock (CK4T); and a selector (S81) that selects an output of said OR circuit (OR81) for a former-half period of the clock (CK4T) and selects for a latter-half period of the clock (CK4T) that is a determination period of said OR circuit (OR82);

a start-aligned control circuit (652) comprising:

flip-flops (F81 and F82) for synchronizing a regulation start signal with the clock (CK3T); and a flip-flop (F83) that applies an AND to a negative output of the flip-flop (F82) and an output of the flip-flop (F83), and sets at an input a signal obtained by applying an OR to its output and an output of the selector (S81) of said first start-aligned conveyer circuit (651);

a lead bit position storage circuit (653) comprising:

n flip-flops with hold (R1, . . . , Rn) that set at a data input an output of the conveyer circuits (CP1, . . . , CPn), fetch data for a former-half period of the clock (CK4T) and yet at a time that an output of said start-aligned control circuit (652) is under regulation, and hold in other conditions; and n flip-flops (Rn+1, . . . , R2n) that set at a data input an output of the conveyer circuits (CPn+1, . . . , CP2n), fetch data for a latter-half period of the clock (CK4T) and yet at a time that an output of said start-aligned control circuit (652) is under regulation, and hold in other conditions; and wherein said alignment circuit (650) comprises:

an OR circuit group that applies an OR to an output of a free lead bit position storage circuit (653), and an output of an n-th lead bit position storage circuit (653) from the lead bit position of this lead bit position storage circuit (653), n selectors (S91, . . . , S9n) that select n bits starting with a lead bit that an output of this OR circuit group indicates from an output of the 1:n de-multiplexer (640), further select for a former-half of the clock (CK4T) when a lead bit is D1, . . . , Dn, and select for a latter-half of the clock (CK4T) when the lead bit is Dn+1, . . . , D2n and D0; and flip-flops (F91, F92, . . . , F9n) that sample n bits of an output of these selectors (S91, S92, . . . , S9n) with a back edge of the clock (CK3T), and wherein said m-way n-bit multiplexer (670) fetches from an m-address n-bit FIFO circuit (660) comprising:

a write address generation (661) that inputs into the first flip-flop a signal obtained by applying an AND to negative outputs from first (m−1) flip-flops out of m flip-flops connected continuously, and applies an INPUT and an AND to the regulation control signal (strt) of said start-aligned control circuit (652) of said first start-aligned detection circuit (650) in inputting the first flip-flop or all flip-flops; and a m×n FIFO (662) having an address number m and a bit number n that writes an output of said alignment circuit (650) as a data input according to a write address, n-bit data written in said m×n FIFO (662) according to the write address; and wherein said n-bit register (680) is n flip-flops (FD0, FD1, FD2, and FD3) that write an output of said m-way n-bit multiplexer (670) with system clock (CLKSYS), and wherein said second data processing circuit (700) comprises:

a second start-aligned conveyer circuit (751) that compares an output of the 1:n de-multiplexer (740) of said second data processing circuit (700) with the second specific signal string as an input;

a third start-aligned conveyer circuit (752) that compares an output of the 1:n de-multiplexer (740) of said second data processing circuit (700) with the third specific signal string as an input; and a regulation control circuit (753) comprising:

a flip-flop (FB4) that applies an AND to an output of said second start-aligned conveyer circuit (751) and an output of a plurality of flip-flops (FB2 and FB3) connected continuously, which obtain a negative output delayed in inputting a same output, and prepares the regulation start signal that is of a pulse waveform to distribute it to all said first data processing circuits (600); and a flip-flop (FB1) that sets at an input a signal obtained by applying an OR to a signal obtained by applying an AND to a negative signal of the regulation start signal and the output of the flip-flop (FB1), and an output of the selector (S81) of said third start-aligned conveyer circuit (752), and prepares a regulation finish signal; and wherein said read address generation circuit (770) sets at an input of the first flip-flop a signal obtained by applying an AND to a negative output of first (m−1) flip-flops (FC2 to FC4) out of m flip-flops (FC2 to FC5)

connected continuously, applies an INPUT and an AND to a read address start signal from a synchronizing circuit (760) in inputting the first or all flip-flops, and distributes to all said first data processing circuit (600) a read address prepared from an output of the m flip-flops (FC2 to FC5), and wherein, when a time became maximized that: the first specific signal string and the third specific signal string were output simultaneously from said second transmitter circuit (300); the first specific signal string was detected in said first start-aligned detection circuit (650) via said first transmitter circuit (200), a transmission line (800), a receiver (610), a sampler and 1:2 de-multiplexer (630) of said first data processing circuit (600), and the 1:n de-multiplexer (640); and the signal string ranging a next bit to n bits was extracted in said alignment circuit (650) and was written into said m-address n-bit FIFO circuit (660), even though a time became minimized that:

the third specific signal string was detected as the third specific signal string in said second start-aligned detection circuit (750) via said second transmitter proc circuit (300), a transmission line (900), a receiver (710), a sampler and 1:2 de-multiplexer (730) of said second data addressing circuit (700), and a 1:n de-multiplexer (740);

the read address was generated via said synchronizing circuit (760) and said read address generation circuit (770); and the data was written into said n-bit register (680) via said m-way n-bit multiplexer (670) by this read address, so that said m-address n-bit FIFO circuit (660) writes the data more later than the signal string reaches said n-bit register (680) via said m-way n-bit multiplexer (670), a number of the flip-flops of said synchronizing circuit (760) was increased, when the time became minimized that: the first specific signal string was detected in the first start-aligned detection circuit (650) via said first transmitter circuit (200), a transmission line (800), a receiver (610), a sampler and 1:2 de-multiplexer (630) of said first data processing circuit (600) and the 1:n de-multiplexer (640); and the bits starting with the next bit to the (m×n+1)th bit from the next bit, which was again written into address o after circulation of address of the m-address n-bit FIFO circuit (660), were extracted in said alignment circuit (650) and were written into address 0 of said m-address n-bit FIFO circuit (660), even though the time became maximized that: the third specific signal string was detected as the third specific signal string in said second start-aligned detection circuit (750) via said second transmitter circuit (300), a transmission line (900), a receiver (710), a sampler and 1:2 de-multiplexer (730) of said second data processing circuit (700), and a 1:n de-multiplexer (740); the read address was generated via said synchronizing circuit (760) and said read address generation circuit (770); and its read address was written into said n-bit register (680) via said m-way n-bit multiplexer (670), so that the m-address n-bit FIFO circuit 660 writes the n-bit data starting with the bit next to the first specific signal string more earlier than the signal string is written into said n-bit register (680) via said m-way n-bit multiplexer (670), the flip-flop number of said synchronizing circuit (760) was increased, and so as to satisfy two conditions, address number of said m-address n-bit FIFO (660) was set at m.

18. The high-speed transmission system having a low latency according to claim 17, wherein said second start-aligned conveyer circuit (751) comprises:

an n-input OR circuit that sets the second specific signal string at all signal strings including 1, and applies an OR to all output of said 1:n de-multiplexer (740) of said second data processing circuit (700).

19. The high-speed transmission system having a low latency according to claim 18, wherein selectors (S91, . . . , S9n) of said alignment circuit (650) of said first data processing circuit (600) are controlled so that selectors (S91, . . . , S9n) are valid when the regulation control signal (strt) of said alignment circuit (650) was set, and they are invalid when it was reset.

20. The high-speed transmission system having a low latency according to claim 17, further comprising:

a first analogue PLL circuit (100) that distributes to said first transmitter circuit (200) and said second transmitter circuit (300) a clock for transmission having an n/2 multiple frequency, which was synchronized with the system clock (CLKSYS); and a second analogue PLL circuit (500) that distributes to said first data processing circuit (600) and said second data processing circuit (700) a clock for transmission having an n/2 multiple frequency, which was synchronized with the system clock (CLKSYS).

21. The high-speed transmission system having a low latency according to claim 20, wherein said first analogue PLL circuit (100), in which the system clock (CLKSYS) in the send side and the system clock (CLKSYS) in the receive side thereof are a synchronized clock, sets at a REF clock input the system clock (CLKSYS) or a signal having a same or a 1/integer frequency, which has a given phase relation with the system clock (CLKSYS), said first analogue PLL circuit (100) comprising:

a voltage control-type variable frequency oscillator (120) that oscillates at an n/2 multiple frequency of the system clock (CLKSYS);

a counter (130) that divides, when an output of this voltage control-type variable frequency oscillator (120) is an n/2 multiple frequency of the system clock (CLKSYS), so that an output has a same frequency as the system clock (CLKSYS); and a phase comparator (110) that makes a phase comparison between an output of this counter(130) and a REF clock to control a control voltage of said voltage control-type variable frequency oscillator (120) so that phases of an output of said counter(130) and a frequency of the REF clock become the same.

22. The high-speed transmission system having a low latency according to claim 21, wherein in said first data processing circuit (600) and in said second data processing circuit (700) is omitted the second analogue PLL circuit (500) distributing the clock for transmission having an n/2 multiple frequency, which was synchronized with the system clock (CLKSYS), and wherein an output of the first analogue PLL circuit (100) in the send side is distributed to said first data processing circuit (600) and said second data processing circuit (700) via a driver (140), a transmission line (1000), and a receiver(540) as a clock for transmission having an n/2 multiple frequency, which was synchronized with the system clock (CLKSYS).

23. The high-speed transmission system having a low latency according to claim 22, wherein the system clock (CLKSYS) in the send side and the system clock (CLKSYS) in the receive side are not synchronized.

24. The high-speed transmission system having a low latency according to claim 17, wherein said pre-emphasis control circuits (230 and 330) comprise:
- a flip-flop (F43) that samples and fetches a positive output of the flip-flop (F40) of said n/2:1 multiplexer (220 and 320) with a leading edge of the sampling clock (CK41);
- a flip-flop (F44) that samples and fetches a positive output of the flip-flop (F41) with a back edge of the sampling clock (CK41) and yet at a next cycle; and
- selectors (S42 and S43) that select a positive output and a negative output of the flip-flop (F44) for a former-half period by setting an inverse signal of the sampling clock (CK41) at a selection signal and obtains a positive output and a negative output of the flip-flop (F43) for a latter-half period, and wherein, to selectors (S40 and S41) which select the positive output and the negative output of the flip-flop (F40) for a former-half period and select the positive output and the negative output of the flip-flop (F42) for a latter-half period as a normal output signal, is output the output with an output amplitude of the drivers (240 and 340) is increased when a negative output of the selector (S42) is a same as the positive output of the selector (S40), and the output with the output amplitude is reduced when it is different, and yet selection can be made from a plurality of pre-emphasis quantity, including no change in a magnitude of amplitude.

* * * * *